(12) United States Patent
Kato et al.

(10) Patent No.: US 9,019,323 B2
(45) Date of Patent: Apr. 28, 2015

(54) DISPLAY DEVICE AND METHOD FOR DRIVING DISPLAY DEVICE

(75) Inventors: Toshiyuki Kato, Osaka (JP); Kohei Ebisuno, Kyoto (JP)

(73) Assignee: Joled, Inc., Tokyo (JP)

( * ) Notice: Subject to any disclaimer, the term of this patent is extended or adjusted under 35 U.S.C. 154(b) by 124 days.

(21) Appl. No.: 13/549,133

(22) Filed: Jul. 13, 2012

(65) Prior Publication Data

US 2012/0280970 A1    Nov. 8, 2012

Related U.S. Application Data

(63) Continuation of application No. PCT/JP2011/003777, filed on Jul. 1, 2011.

(30) Foreign Application Priority Data

Jul. 2, 2010    (JP) ................................. 2010-151553

(51) Int. Cl.
| | | |
|---|---|---|
| G09G 5/10 | (2006.01) | |
| G09G 3/32 | (2006.01) | |
| H01L 27/32 | (2006.01) | |

(52) U.S. Cl.
CPC ...... *G09G 3/3291* (2013.01); *G09G 2320/0223* (2013.01); *G09G 2320/0233* (2013.01); *G09G 2320/0626* (2013.01);
(Continued)

(58) Field of Classification Search
USPC ..................... 345/76–83, 211–213, 690–693; 315/169.1–169.3
See application file for complete search history.

(56) References Cited

U.S. PATENT DOCUMENTS

| | | |
|---|---|---|
| 7,071,635 B2 | 7/2006 | Inoue et al. |
| 7,474,282 B2 | 1/2009 | Okamoto |

(Continued)

FOREIGN PATENT DOCUMENTS

| | | |
|---|---|---|
| JP | 2000-242208 A | 9/2000 |
| JP | 2002-116728 A | 4/2002 |

(Continued)

OTHER PUBLICATIONS

International Search Report issued in International Patent Application No. PCT/JP2011/003777, mailed Aug. 2, 2011.

(Continued)

*Primary Examiner* — Jennifer Nguyen
(74) *Attorney, Agent, or Firm* — McDermott Will & Emery LLP

(57) ABSTRACT

A display device according to the present invention includes: a variable voltage source which supplies a supply voltage to an organic EL display unit; and a voltage regulating unit which regulates an external application voltage output by the variable voltage source, the organic EL display unit further includes an anode-side power source line network and a cathode-side power source line network connected to the pixels and the variable voltage source, the display device further includes a voltage measuring unit which measures a voltage for a monitor pixel, and the voltage regulating unit which calculates distributions of voltage drop amount generated in the anode-side power source line network and the cathode-side power source line network, calculates a voltage for the monitor pixel from the distributions of the voltage drop amount calculated, and regulates the supply voltage based on the calculation result and the voltage measured by the voltage measuring unit.

14 Claims, 17 Drawing Sheets

(52) U.S. Cl.
 CPC ..... *G09G 2330/021* (2013.01); *G09G 2360/16* (2013.01); *H01L 27/3244* (2013.01); *G09G 2320/0295* (2013.01)

(56) References Cited

U.S. PATENT DOCUMENTS

| | | | |
|---|---|---|---|
| 7,619,598 B2 * | 11/2009 | Pulvirenti et al. | 345/82 |
| 7,872,619 B2 | 1/2011 | Miller et al. | |
| 7,973,745 B2 | 7/2011 | Mizukoshi et al. | |
| 8,089,428 B2 | 1/2012 | Yaguchi et al. | |
| 2003/0201955 A1 * | 10/2003 | Song et al. | 345/76 |
| 2004/0076018 A1 | 4/2004 | Okamoto | |
| 2004/0183483 A1 | 9/2004 | Inoue et al. | |
| 2006/0038836 A1 * | 2/2006 | Abe et al. | 345/690 |
| 2007/0145902 A1 | 6/2007 | Yaguchi et al. | |
| 2008/0018640 A1 | 1/2008 | Tada et al. | |
| 2008/0100542 A1 | 5/2008 | Miller et al. | |
| 2008/0266216 A1 | 10/2008 | Choi | |
| 2008/0284688 A1 | 11/2008 | Marx et al. | |
| 2009/0207106 A1 * | 8/2009 | Mizukoshi et al. | 345/76 |
| 2009/0207160 A1 | 8/2009 | Shirasaki et al. | |
| 2009/0225072 A1 | 9/2009 | Mizukoshi et al. | |
| 2010/0020065 A1 | 1/2010 | Takasugi | |
| 2010/0026732 A1 | 2/2010 | Otawara | |
| 2010/0033461 A1 | 2/2010 | Hasegawa et al. | |
| 2010/0033469 A1 | 2/2010 | Nathan et al. | |
| 2010/0109985 A1 | 5/2010 | Ono | |
| 2010/0171774 A1 | 7/2010 | Mizukoshi et al. | |
| 2010/0201674 A1 * | 8/2010 | Kim et al. | 345/211 |

FOREIGN PATENT DOCUMENTS

| | | |
|---|---|---|
| JP | 2003-216108 A | 7/2003 |
| JP | 2003-280590 | 10/2003 |
| JP | 2005-283823 A | 10/2005 |
| JP | 2006-065148 | 3/2006 |
| JP | 2006-251602 | 9/2006 |
| JP | 2007-121430 A | 5/2007 |
| JP | 2008-502015 | 1/2008 |
| JP | 2008-185809 | 8/2008 |
| JP | 2008-268914 | 11/2008 |
| JP | 2009-031451 | 2/2009 |
| JP | 2009-162980 | 7/2009 |
| JP | 2009-198691 | 9/2009 |
| JP | 2009-216801 | 9/2009 |
| JP | 2010-039046 | 2/2010 |
| JP | 2010-508559 | 3/2010 |
| WO | WO 03/027999 A1 | 4/2003 |
| WO | WO 2005/122120 A2 | 12/2005 |
| WO | WO 2008/057187 A1 | 5/2008 |
| WO | WO 2009/011092 A1 | 1/2009 |
| WO | WO 2009/014634 A2 | 1/2009 |

OTHER PUBLICATIONS

Japanese Office Action issued in Japanese Application No. 2012-522476, dated Feb. 24, 2015.

* cited by examiner

Image A

Anode side

Voltage drop amount [V]
- 7 - 8
- 6 - 7
- 5 - 6
- 4 - 5
- 3 - 4
- 2 - 3
- 1 - 2
- 0 - 1

Cathode side

Voltage drop amount [V]
- 5 - 6
- 4 - 5
- 3 - 4
- 2 - 3
- 1 - 2
- 0 - 1

Image B

DISPLAY DEVICE AND METHOD FOR DRIVING DISPLAY DEVICE

CROSS REFERENCE TO RELATED APPLICATIONS

This is a continuation application of PCT Patent Application No. PCT/JP2011/003777 filed on Jul. 1, 2011, designating the United States of America, which is based on and claims priority of Japanese Patent Application No. 2010-151553 filed on Jul. 2, 2010. The entire disclosures of the above-identified applications, including the specifications, drawings and claims are incorporated herein by reference in their entirety.

TECHNICAL FIELD

The present invention relates to an active-matrix display device which uses current-driven light-emitting elements represented by organic electroluminescence (EL) elements, and a method for driving the display device.

BACKGROUND ART

In general, the luminance of an organic electroluminescence (EL) element is dependent upon the drive current supplied to the element, and the luminance of the light emitted by the element increases in proportion to the drive current. Therefore, the power consumption of displays made up of organic EL elements is determined by the average of display luminance. Specifically, unlike liquid crystal displays, the power consumption of organic EL displays varies significantly depending on the displayed image.

For example, in an organic EL display, the highest power consumption is required when displaying an all-white image, whereas, in the case of a typical natural image, power consumption which is approximately 20 to 40% that for all-white is considered to be sufficient.

However, because power source circuit design and battery capacity entail designing which assumes the case where the power consumption of a display becomes its highest, it is necessary to consider power consumption that is 3 to 4 times that for the typical natural image, and thus becoming a hindrance to the lowering of power consumption and the miniaturization of devices.

In response, there is conventionally proposed a technique which suppresses power consumption with practically no drop in display luminance, by detecting the peak value of video data and adjusting the cathode voltage of the organic EL elements based on such detected data so as to reduce power source voltage (for example, see Patent Literature 1).

CITATION LIST

Patent Literature

[Patent Literature 1] Japanese Unexamined Patent Application Publication No. 2006-65148

SUMMARY OF INVENTION

Technical Problem

Now, since an organic EL element is a current-driven element, current flows through a power source line and a voltage drop which is proportionate to the line resistance occurs. As such, the power supply voltage to be supplied to the display is set by adding a voltage drop margin for compensating for a voltage drop.

In the same manner as the previously described power source circuit design and battery capacity, since the power drop margin for compensating for a voltage drop is set assuming the case where the power consumption of the display becomes highest, unnecessary power is consumed for typical natural images.

In a small-sized display intended for mobile device use, panel current is small and thus, compared to the voltage to be consumed by pixels, the voltage margin for compensating for a voltage drop is negligibly small.

However, when current increases with the enlargement of panels, the voltage drop occurring in the power source line becomes no longer negligible.

In the conventional technique in the above-mentioned Patent Reference 1, although power consumption in each of the pixels can be reduced, the power drop margin for compensating for a voltage drop cannot be reduced, and thus the power consumption reducing effect for household large-sized display devices of 30-inches and above is insufficient. For example, the external application voltages when the image A and the image B each of which includes a white window displayed in the black background shall be considered. Here, it is assumed that the white window is displayed at the center in the image A, and the white window is displayed at the corner in the image B.

In this case, in the conventional technology, the peak values of the video signals for the image A and the image B are identical. Accordingly, the same external application voltage is set.

However, when comparing the voltage drop in the power source line, the voltage drop amount when displaying the image B is smaller than the voltage drop amount when displaying the image A. More specifically, when displaying the image B, it is possible to set the external application voltage to be smaller then the external application voltage when displaying the image A so as to suppress the power consumption. In other words, with the conventional technology, the voltage drop margin is more than necessary when displaying the image B, causing a problem of increased power consumption.

With the conventional technology, the external application voltage is regulated based on the peak values of the video data. As a result, there is a problem that it is difficult to respond to the temporal changes in the characteristics of the organic EL display panel.

The present invention has been conceived in view of the problems described above, and it is an object of the present invention to provide a display device capable of responding to the temporal changes and significantly reducing the power consumption, and the method for driving the display device.

Solution to Problem

In order to achieve the object above, the display device according to the present invention is a display device includes a display unit having a plurality of pixels that are arranged two-dimensionally, the display device further includes: a voltage source which supplies a supply voltage to the display unit; and a voltage regulating unit which regulates the supply voltage output by the voltage source, according to video data indicating luminance of each of the plurality of pixels, in which the display unit further includes at least one power source line connected to the pixels and the voltage source, for supplying the supply voltage from the voltage source, the display device further includes a voltage measuring unit configured to measure a voltage which is supplied to a predetermined one of the pixels through the at least one power source line, and the voltage regulating unit is configured to calculate, from the video data, a distribution of a voltage drop amount generated in the at least one power source line, to calculate a voltage at the at least one power source line in the predetermined one of the pixels from the distribution of the voltage drop amount calculated, and to regulate the supply voltage based on the calculation result and the voltage measured by the voltage measuring unit.

With this, the supply voltage supplied from the voltage source according to the video data can be regulated. Thus, it is possible to achieve significant reduction of the power consumption. For example, when comparing an image with the white window displayed at the center of the black background and an image with the white window displayed at the corner of the black background, the margin for the voltage increase corresponding to the voltage drop amount can be suppressed when the white window is displayed at the corner of the black background. Stated differently, by regulating the voltage based on the distribution of the voltage drop amount in the display unit, the voltage for video data can be regulated accordingly even if the peak values of the video data are identical and video data for two different images are input. Therefore, the power consumption can be reduced.

In addition, a voltage supplied through the at least one power source line for the predetermined one of the pixels is measured, and the voltage is regulated based on the measurement result and the calculation result by the voltage source regulating unit. Therefore, it is possible to appropriately respond to the temporal change in the display unit. For example, when the measured result and the calculation result are substantially equal, it is considered that there is no temporal change, and the voltage is regulated based on the measuring result or the calculation result. On the other hand, when the measuring result and the calculation result are different, it is considered that there is a temporal change, and the external application voltage is regulated based on the temporal change corresponding to the measuring result and the calculation result.

As described above, the display device according to the present invention is capable of responding to the temporal change, and reducing the power consumption.

A monitor line having one end connected to the predetermined one of the pixels and the other end connected to the voltage measuring unit may be included, the monitor line being for transmitting the voltage supplied to the predetermined one of the pixels through the at least one power source line.

A distribution of the voltage drop amount for blocks each including a plurality of the pixels, obtained by dividing the pixels equally in a column direction and a row direction may be calculated.

With this, it is possible to regulate voltage with less operation amount. Accordingly, it is possible to reduce the cost.

The voltage regulating unit may regulate the supply voltage, using a difference between the voltage calculated and the voltage measured by the voltage measuring unit, and a maximum value of the distribution of the voltage drop amount.

With this, it is possible to prevent the reduction in luminance of the pixel due to insufficient voltage.

The voltage regulating unit may regulate the supply voltage, using a ratio of the voltage calculated to the voltage measured by the voltage measuring unit, and a maximum value of the distribution of the voltage drop amount.

The voltage source may supply a first voltage and a second voltage to the display unit, the second voltage being different from the first voltage, the at least one power source line may include a first power source line for supplying the first voltage and a second power source line for supplying the second voltage, and the voltage regulating unit may calculate a first distribution and a second distribution, the first distribution being a distribution of the voltage drop amount in the first power source line, the second distribution being a distribution of the voltage drop amount in the second power line, and regulate the first voltage and the second voltage, based on a first distribution and a second distribution for each of the pixels calculated, respectively.

With this, even when the display device includes two power source lines (the first power source line and the second power source line), it is possible to respond to the temporal changes, and reduce the power consumption.

The voltage regulating unit may regulate the first voltage and the second voltage, using a sum of a maximum value of the first distribution and a maximum value of the second distribution.

With this, even when the display device includes the two power source lines (the first power source line and the second power source line), it is possible to prevent the reduction in luminance of the pixels due to insufficient voltage.

The voltage regulating unit may calculate a total voltage drop amount which is a sum of the voltage drop amount in the first power source line and the voltage drop amount in the second power source line, by adding the first distribution and the second distribution for each of the pixels, and regulate the first voltage and the second voltage, using a maximum value of the distribution of the total voltage drop amount calculated.

With this, it is possible to reduce the power consumption further when the position in the display unit at which the voltage drop amount in the first power source line is maximum and the position in the display unit at which the voltage drop amount in the second power source line is maximum do not match, it is possible to reduce the power consumption further.

Each of the pixels includes a driver element and a light-emitting element, the driver element includes a source electrode and a drain electrode, the light-emitting element includes a first electrode and a second electrode, the first electrode connected to one of the source electrode and the drain electrode of the driver element, and one of (i) the other of the source electrode and the drain electrode and (ii) the second electrode is connected to the first power source line, and the other of (i) the other of the source electrode and the drain electrode and (ii) the second electrode is connected to the second power source line.

The second electrode may be a part of a common electrode provided common to the pixels, and the common electrode may be electrically connected to the voltage source such that a voltage is applied from a periphery of the common electrode.

The second electrode may be formed of a transparent conductive material made of a metal oxide.

The light-emitting element may be an organic EL element.

The present invention can be implemented not only as the display device but also as a method for driving the display device including the processing units composing the display device as steps.

The method for driving the display device according to the present invention is a method for driving a display device including a display unit having a plurality of pixels that are arranged two-dimensionally, and a voltage source which supplies a supply voltage to the display unit, the display unit further including at least one power source line connected to the pixels and the voltage source, for supplying the supply voltage from the voltage source, the method including: calculating a distribution of a voltage drop amount generated in the at least one power source line, from video data indicating luminance of each of the pixels; calculating a voltage at the at least one power supply line, for a predetermined one of the pixels, from the distribution of the voltage drop amount calculated; measuring a voltage supplied to the predetermined one of the pixels through the at least one power supply line; and regulating the supply voltage, based on a voltage in the predetermined one of the pixels calculated and the voltage in the predetermined one of the pixels measured.

When calculating the distribution of the voltage drop amount, a distribution of the voltage drop amount is calculated for blocks each including M pixels, obtained by dividing the pixels equally in a row direction and a column direction, where M is an integer greater than or equal to 2.

Advantageous Effects of Invention

According to the present invention, the temporal changes are appropriately addressed, and the display device having high power consumption reducing effect and the method for driving the display device can be implemented.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings.

DESCRIPTION OF EMBODIMENT(S)

Embodiment 1

The following shall describe embodiments of the present invention with reference to the drawings.

Embodiment 1

The display device according to this embodiment is a display device including a display unit having a plurality of pixels that are arranged two-dimensionally, and the display device includes: a voltage source which supplies a supply voltage to the display unit; and a voltage regulating unit which regulates the supply voltage output by the voltage source, according to video data indicating luminance of each of the plurality of pixels, in which the display unit further includes at least one power source line connected to the pixels and the voltage source, for supplying the supply voltage from the voltage source, the display device further includes a voltage measuring unit which measures a voltage which is supplied to a predetermined one of the pixels through the at least one power source line, and the voltage regulating unit calculates, from the video data, a distribution of a voltage drop amount generated in the at least one power source line, to calculate a voltage at the at least one power source line in the predetermined one of the pixels from the distribution of the voltage drop amount calculated, and to regulate the supply voltage based on the calculation result and the voltage measured by the voltage measuring unit.

With this, the display device according to the embodiment 1 is capable of responding to the temporal changes, and significantly reducing the power consumption.

Figure 1:
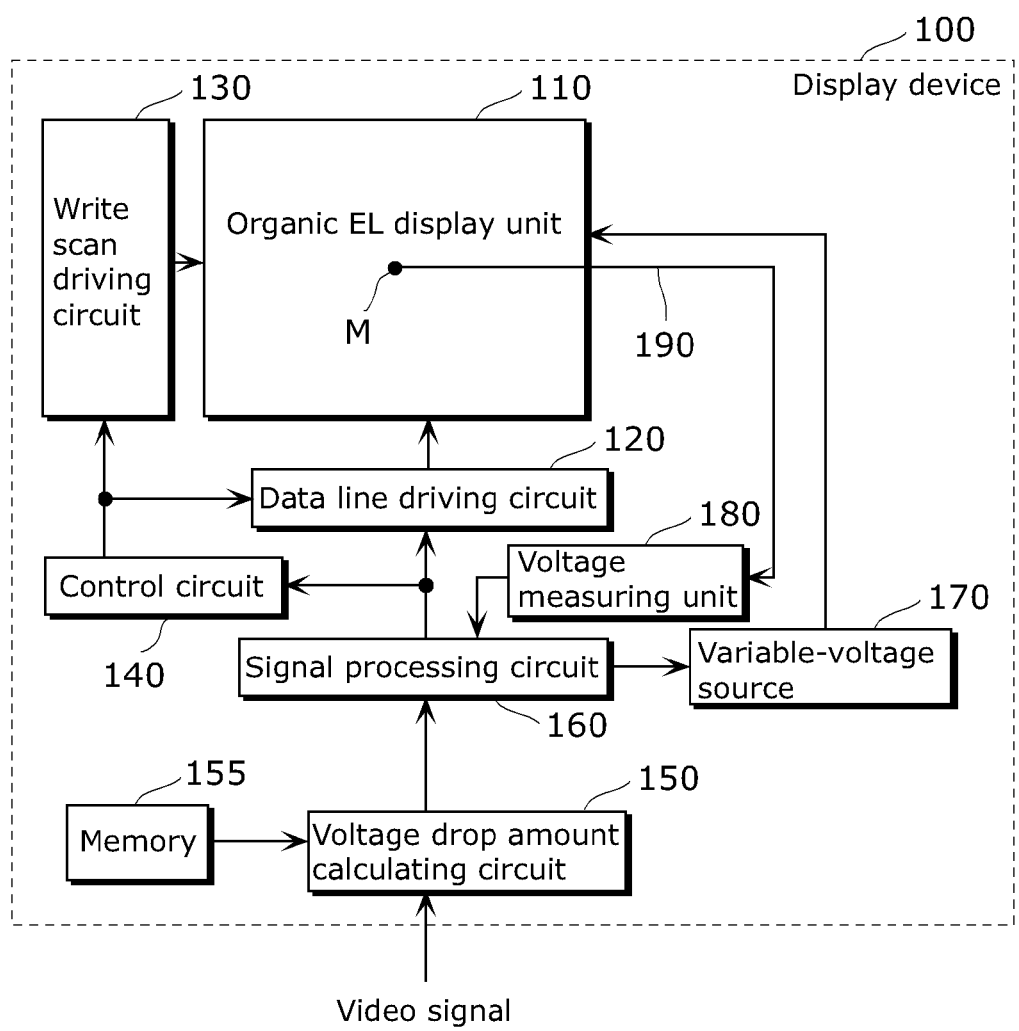
FIG. 1 is a block diagram showing an outline configuration of a display device according to the embodiment 1.

FIG. 1 is a block diagram showing an outline configuration of the display device according to the embodiment.

A display device 100 shown in the figure includes an organic EL display unit 110, a data line driving circuit 120, a write scan driving circuit 130, a control circuit 140, a voltage drop amount calculating circuit 150, a memory 155, a signal processing circuit 160, a variable-voltage source 170, a voltage measuring unit 180, and a monitor line 190.

Figure 2:
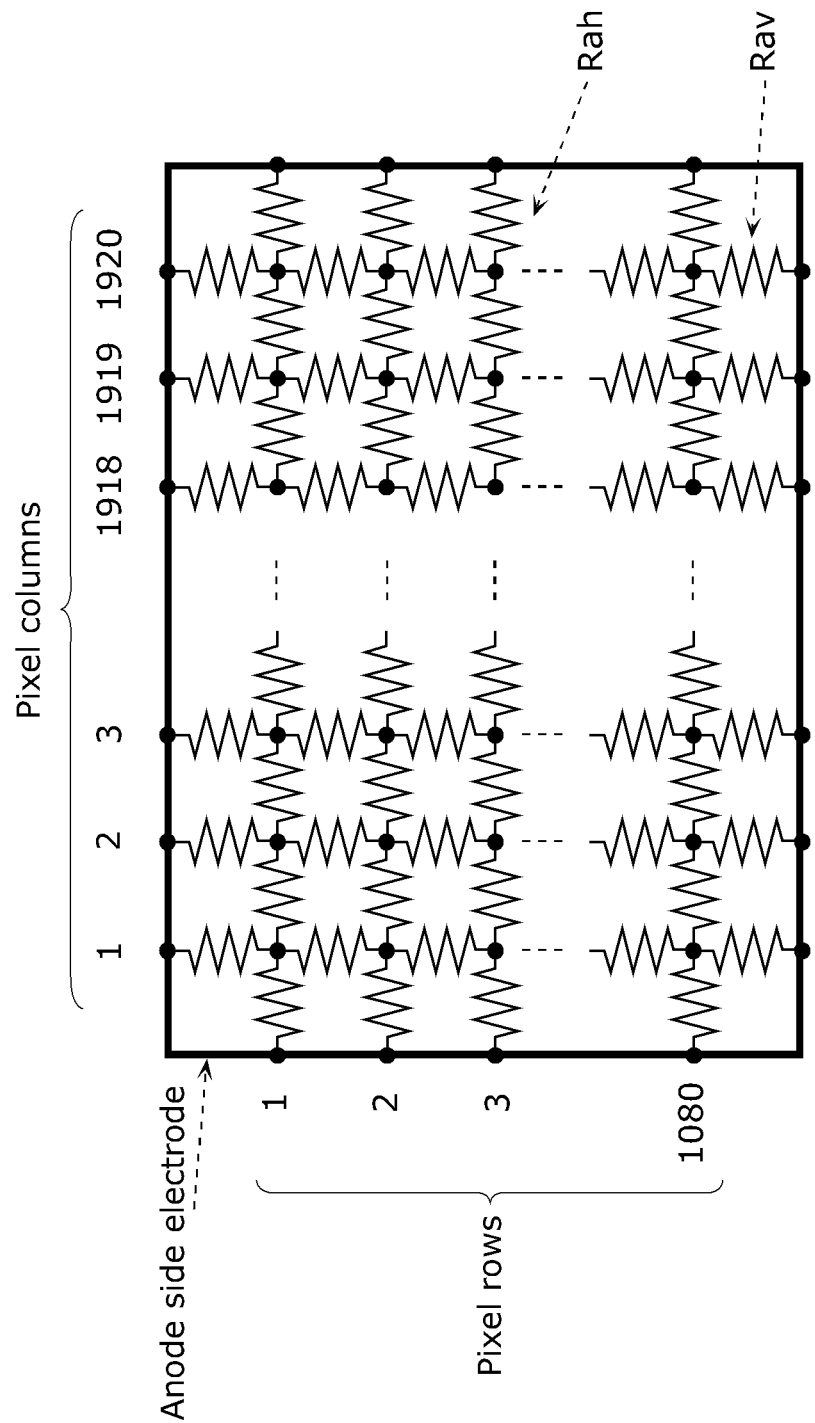
FIG. 2 is a diagram schematically illustrating a model of the anode-side power source line network in an organic EL display unit having 1920 pixels horizontally and 1080 pixels vertically.

FIG. 2 is a diagram schematically illustrating a model of the anode-side power line network in the organic EL display unit 110 having 1920 pixels horizontally and 1080 pixels vertically.

Each pixel is connected to neighboring pixels above, below, on lateral sides by the horizontal resistance component Rah and the vertical resistance component Ray, and the peripheral part is connected to the anode side electrode to which external voltage is applied.

Figure 3:
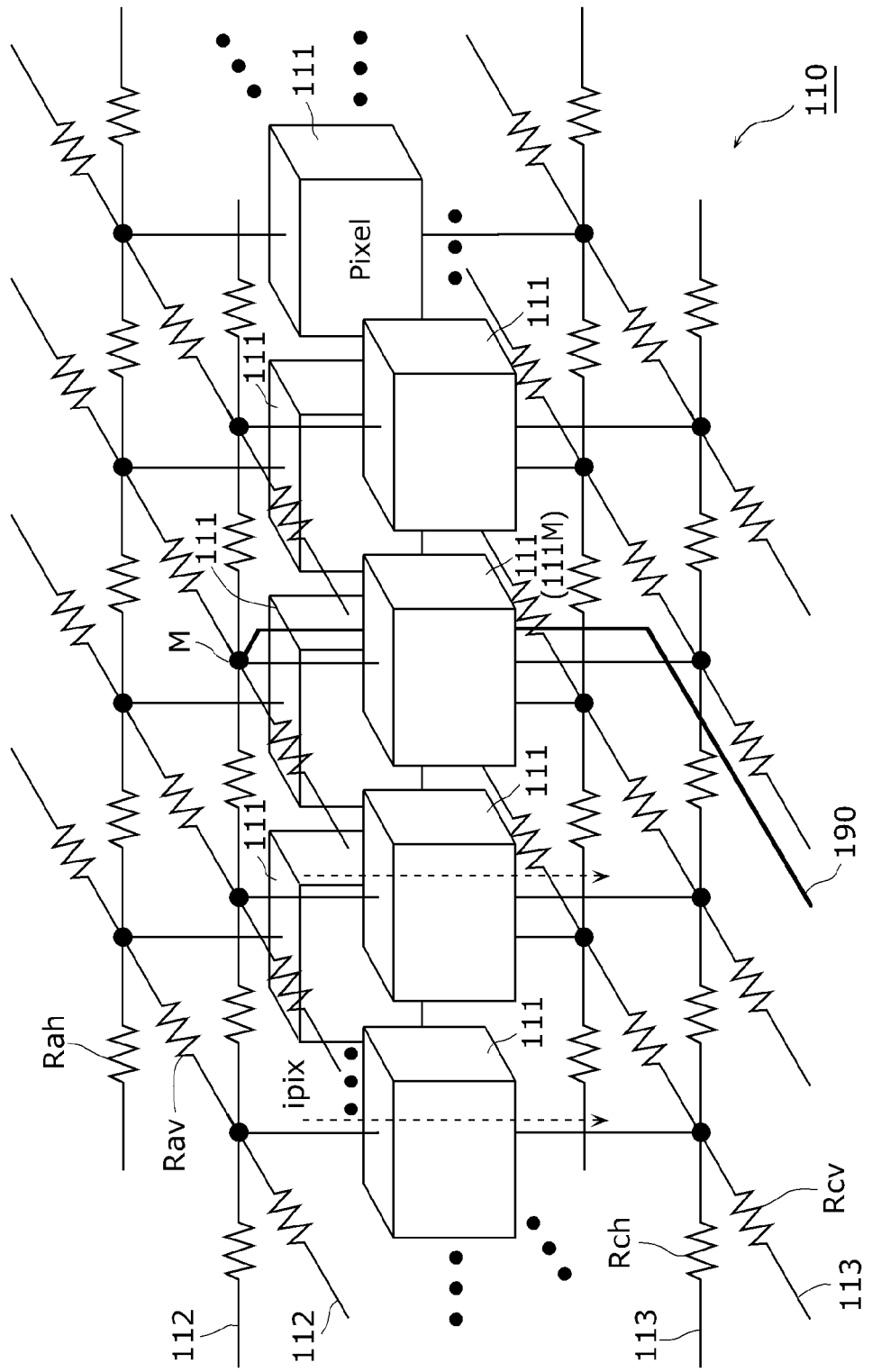
FIG. 3 is a perspective view schematically showing a configuration of an organic EL display unit.

FIG. 3 is a perspective view schematically illustrating the configuration of the organic EL display unit 110. Note that the lower part of the figure is the display screen side.

As shown in the figure, the organic EL display unit 110 includes pixels 111, an anode-side power source line 112, and a cathode-side power source line 113.

Each pixel 111 is connected to the first power source line network 112 and the second power source line network 113, and emits light at luminance that is in accordance with a pixel current ipix that flows to the pixel 111. At least one predetermined pixel out of the pixels 111 is connected to the monitor line 190 at a monitoring point M. In the following description, a pixel directly connected to monitor line 190 is referred to as a monitor pixel 111M. The monitor pixel 111M is provided, for example, near the center of the organic EL display unit 110. Note that, the area near the center includes the center and an area around the center.

The anode-side power source line network 112 is formed, for example, in a net shape. On the other hand, the cathode-side power source line network 113 is formed in the form of a continuous film on the organic EL display unit 110, and a voltage provided by the variable voltage source 170 is applied from the peripheral part of the organic EL display unit 110. In FIG. 3, the anode-side power source line network 112 and the cathode-side power source line network 113 are schematically illustrated in mesh-form in order to show the resistance components of the anode-side power source line network 112 and the cathode-side power source line network 113. Note that, the cathode-side power source line network 113 is a ground line, for example, and may be grounded on a common electric potential in the display device 100 at the peripheral portion of the organic EL display unit 110.

In the anode-side power source line network 112, horizontal resistance component Rah and vertical resistance component Rav exist. In the cathode-side power source line network 113, horizontal resistance component Rch and vertical resistance component Rcv exist. Note that, although not illustrated, each of the pixels 111 is connected to the write scan driving circuit 130 and the data line driving circuit 120, and is also connected to a scanning line for controlling the timing at which the pixel emits light and stops emitting light, and to a data line for supplying signal voltage corresponding to the luminance of light emitted from the pixel 111.

Figure 4:
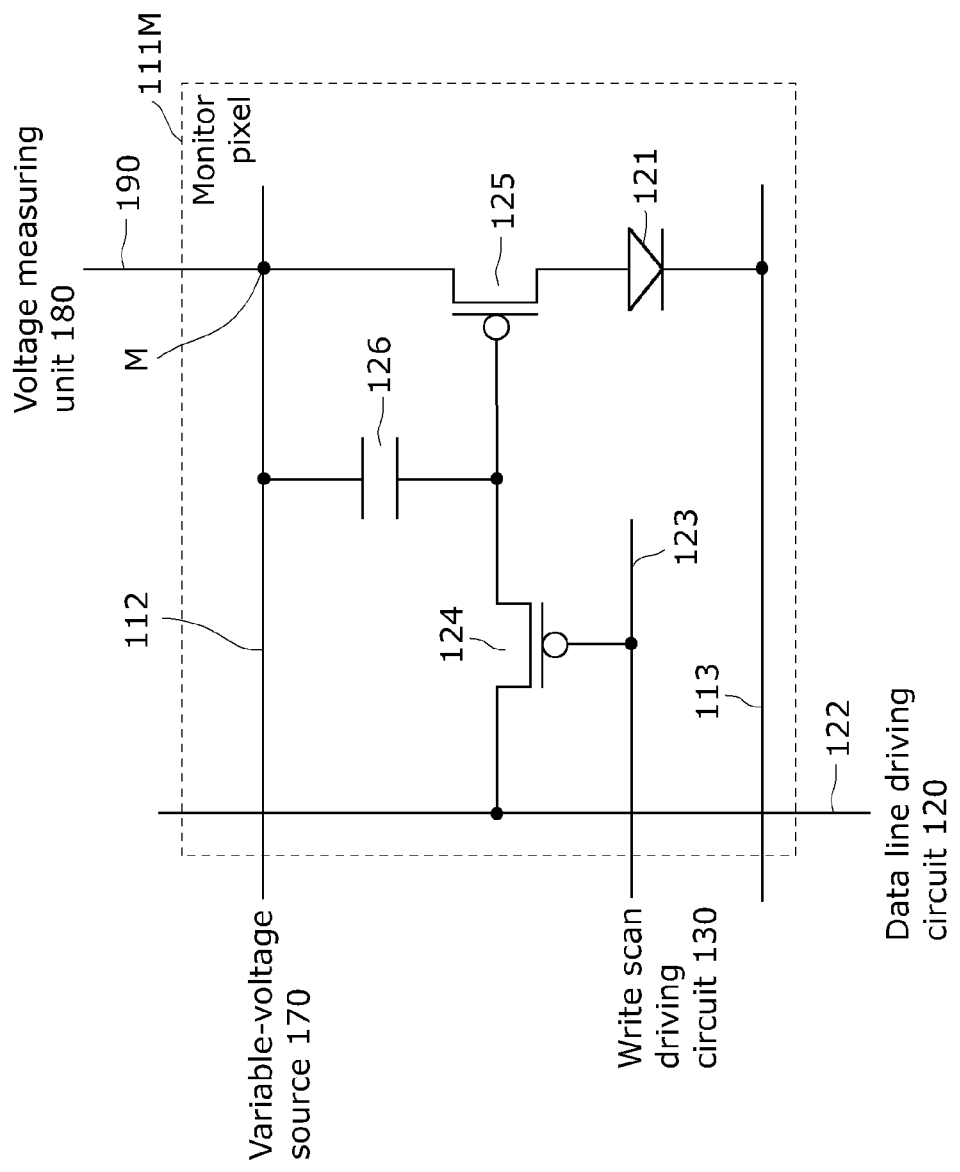
FIG. 4 is a circuit diagram illustrating an example of specific configuration of the pixel.

FIG. 4 is a circuit diagram illustrating an example of a specific configuration of the pixel 111. Note that, FIG. 4 illustrates the configuration of the monitor pixel 111M. The pixels 111 other than the monitor pixel 111M are different from the monitor pixel 111M illustrated in FIG. 4 in that the monitor line 190 is not connected.

The monitor pixel 111M in FIG. 4 includes a driver element and a light-emitting element. The driver element includes a source electrode and a drain electrode. The light-emitting element includes a first electrode and a second electrode, and the first electrode is connected to one of the source electrode and the drain electrode of the driver element. The high-side voltage (anode-side voltage) is applied to one of (i) the other of the source electrode and the drain electrode and (ii) the second electrode, and the low-side voltage (cathode-side voltage) is applied to the other of (i) the other of the source electrode and the drain electrode and (ii) the second electrode. Specifically, each of the pixels 111 includes an organic EL element 121, a data line 122, a scanning line 123, a switch transistor 124, a driving transistor 125, and a capacitor 126. The pixels 111 are arranged two-dimensionally in the organic EL display unit 110, for example.

The organic EL element 121 is an example of a light-emitting element having an anode electrode connected to the drain electrode of the driving transistor 125 and a cathode electrode connected to the cathode-side power source line network 113, and emits light with luminance that is in accordance with the current value flowing between the anode and the cathode. The cathode-side electrode of the organic EL element 121 forms part of a common electrode provided in common to the pixels 111. The common electrode is electrically connected to the variable-voltage source 170 so that potential is applied to the common electrode from the peripheral part thereof. Specifically, the common electrode functions as the cathode-side power source line network 113 in the organic EL display unit 110. Furthermore, the cathode-side electrode is formed of a transparent conductive material made of a metallic oxide. Note that, the electrode on the anode side of the organic EL element 121 is an example of the first electrode, and the electrode on the cathode side of the organic EL element 121 is an example of the second electrode. The cathode-side power source line network 113 is an example of a second power source line network.

The data line 122 is connected to the data line driving circuit 120 and one of the source electrode and the drain electrode of the switch transistor 124, and signal voltage corresponding to video signal (video data) is applied to the data line 122 by the data line driving circuit 120.

The scanning line 123 is connected to the write scan driving circuit 130 and the gate electrode of the switch transistor 124, and switches between on and off of the switching transistor 124 according to the voltage applied by the write scan driving circuit 130.

The switching transistor 124 has one of a source electrode and a drain electrode connected to the data line 122, the other of the source electrode and the drain electrode connected to the gate electrode of the driving transistor 125 and one end of the capacitor 126, and is, for example, a p-type thin-film transistor (TFT).

The driving transistor 125 is an example of the driver element having a source electrode connected to anode-side power source line network 112, a drain electrode connected to the anode electrode of the organic EL element 121, and a gate electrode connected to the one end of the capacitor 126 and the other of the source electrode and the drain electrode of the switching transistor 124, and is, for example, a p-type TFT. With this, the driving transistor 125 supplies the organic EL element 121 with current that is in accordance with the voltage held in the capacitor 126. The anode-side power source line network 112 is an example of a first power source line. In the monitor pixel 111M, the source electrode of the driving transistor 125 is connected to the monitor line 190.

The capacitor 126 has one end connected to the other of the source electrode and the drain electrode of the switch transistor 124, and the other end connected to the anode-side power source line network 112, and holds the potential difference between the potential of the anode-side power source line network 112 and the potential of the gate electrode of the driving transistor 125 when the switch transistor 124 is switched off. Specifically, the capacitor 126 holds a voltage corresponding to the signal voltage.

The data line driving circuit 120 outputs signal voltage corresponding to video signal, to the pixels 111 via the data lines 122.

The write scan driving circuit 130 sequentially scans the pixels 111 by outputting a scanning signal to scanning lines 123. Specifically, the switch transistors 124 are switched on and off per row. With this, the signal voltages outputted to the data lines 122 are applied to the pixels 111 in the row selected by the write scan driving circuit 130. Therefore, the pixels 111 emit light with luminance that is in accordance with the video signal.

The control circuit 140 instructs the drive timing to each of the data line driving circuit 120 and the write scan driving circuit 130.

The memory 155 is a storage unit in which numerical data of the horizontal resistance component Rah and the vertical component Rav in the anode-side power source line network 112 and the horizontal resistance component Rch and the vertical resistance component Rcv in the cathode-side power supply line network 113, which are illustrated in FIGS. 2 and 3 are stored in advance.

The voltage drop amount calculating circuit 150 calculates a distribution of voltage drop amount in the anode-side power source line network 112 and a distribution of voltage drop in the cathode-side power source line network 113, based on the video signal input to the display device 100, the horizontal resistance component Rah, the vertical resistance component Rav, the horizontal resistance component Rch, and the vertical resistance component Rcv read from the memory 155, and outputs the calculated distribution of voltage drop in the anode-side power source line network 112 and the calculated distribution of voltage drop in the cathode-side power source line network 113 to the signal processing circuit 160.

The signal processing circuit 160 calculates a voltage in the anode-side power source line network 112 at the monitor pixel 111M (voltage at the monitoring point M) from the distribution of the voltage drop amount in the voltage drop amount in the anode-side power source line network 112 calculated by the voltage drop amount calculating circuit 150 and the distribution of the cathode-side power source line network 113, and controls the variable voltage 170 based on the calculation result and the voltage at the monitoring point M measured by the voltage measuring unit 180. More specifically, the signal processing circuit 160 calculates the maximum voltage drop amount in the organic EL display unit 110 from the distribution of the voltage drop amount in the anode-side power source line network 112 and the distribution of the voltage drop amount in the cathode-side power source line network 113. The maximum voltage drop amount is the maximum value of the distribution of total voltage drop amount which is a distribution of the voltage drop amount calculated by adding the distribution of the voltage drop amount in the anode-side power source line network 112 and the distribution of the voltage drop amount in the cathode-side power source line network 113 for each pixel 111.

Note that, in this embodiment, the voltage drop amount calculating circuit 150 and the signal processing circuit 160 are examples of the voltage regulating unit.

The variable-voltage source 170 is an example of a voltage source, and supplies an anode-side voltage and a cathode-side voltage to the organic EL display unit 110 as the power source voltage. The variable voltage source 170 is a variable voltage power source which changes an external application voltage (anode-side voltage and cathode-side voltage) which is an example of the supply voltage, according to the voltage instructed by the signal processing circuit 160. Note that, the detailed configuration of the variable voltage source 170 shall be described later.

The voltage measuring unit 180 is an example of the voltage measuring unit, and measures the voltage at the monitoring point M.

The display device 100 according to the embodiment with the configuration described above calculates, from the input video signal, the distribution of the voltage drop amount generated in the anode-side power source line network 112 and the distribution of the voltage drop amount generated in the cathode-side power source line network 113, calculates the voltage at the monitoring point M from the distribution of the voltage drop amount calculated, and regulates the external application voltage output from the variable voltage source 170, based on the calculation result and the voltage measured by the voltage measuring unit 180.

Next, the operation of the display device 100 according to the present invention shall be described.

In the conventional display device, a control in which the peak signal for each frame is extracted from the input video signal, for example, a peak signal for each frame is extracted, and a voltage required for driving the driver element and the organic EL element according to the peak signal is set so as to regulate the power source voltage. In contrast, in the display device 100 according to the present invention, the voltage drop amount is calculated by performing a calculation using horizontal resistance component (Rah, Rch) and vertical resistance component (Rav, Rcv) in the power source line network stored in the memory 155 in advance, in addition to the video signal.

Figure 5:
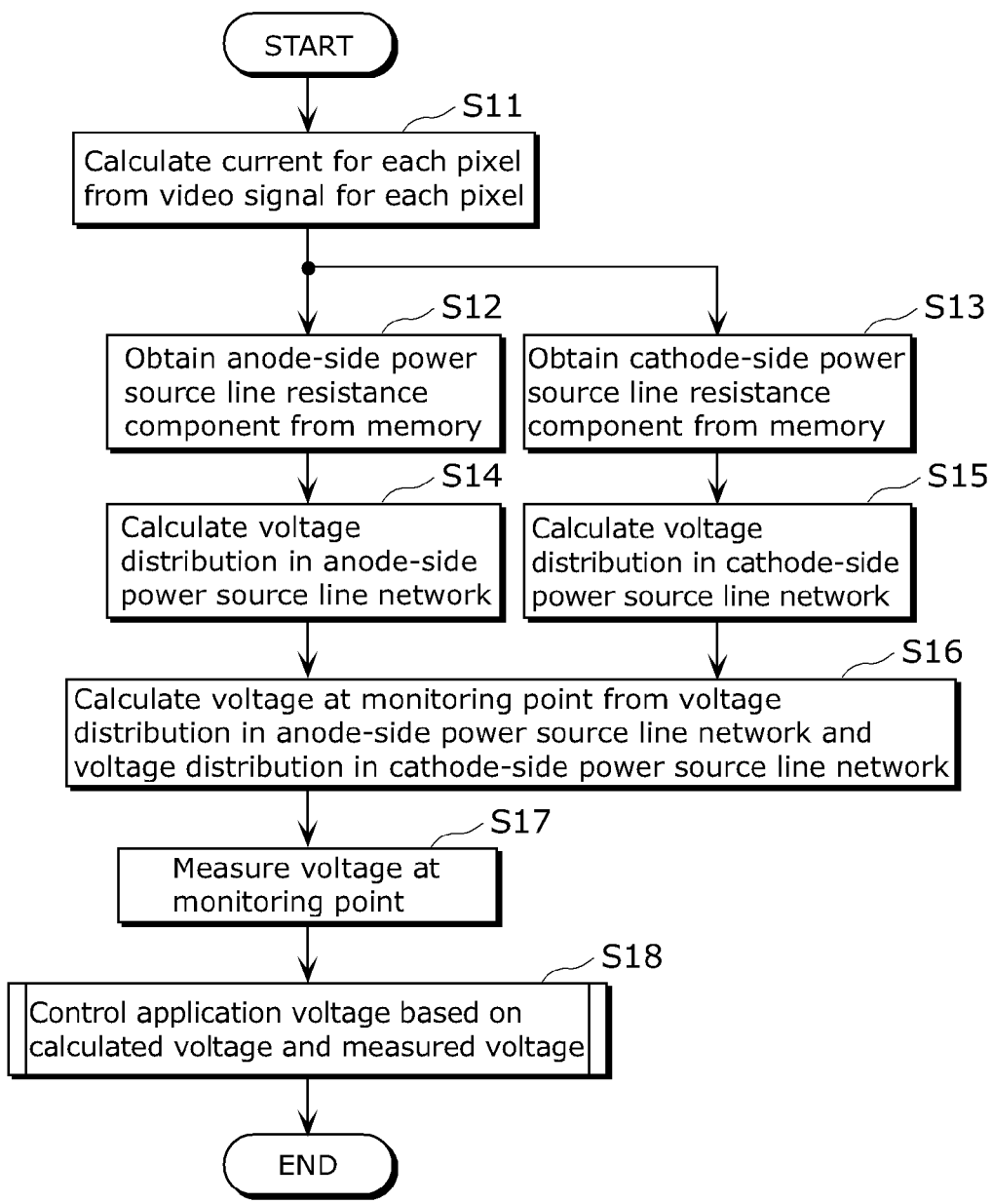
FIG. 5 is a flowchart showing an operation of a display device.

FIG. 5 is a flowchart showing an operation of the display device 100.

First, the voltage drop amount calculating circuit 150 calculates current flowing in each pixel from the video signal, using the conversion formula or the conversion table for the video signal and pixel current that is set in advance (step S11). More specifically, the voltage drop amount calculating circuit 150 obtains a video signal for one frame input to the display device 100, and calculates the pixel current flowing in each pixel 111 from the obtained video signal. Here, the voltage drop amount calculating circuit 150 has the conversion formula or the conversion table for associating the video signal and the pixel current when the pixel 111 emits light at the luminance corresponding to the video signal. Using the conversion formula or the conversion table, the voltage drop amount calculating circuit 150 calculates the pixel current flowing in the pixel 111, from the video signal for one frame input to the display device 100.

Next, the voltage drop amount calculating circuit 150 obtains the horizontal resistance component Rah and the vertical resistance component Rav in the anode-side power source line network 112, from the memory 155 (step S12).

Next, the voltage drop amount calculating circuit 150 calculates the voltage distribution of the anode-side power source line network 112 (step S14). More specifically, when the amount of voltage drop of the anode-side power source line network 112 is va(h, v), and the pixel current is i(h, v) in the pixel coordinates (h, v), the following equation 1 is derived with respect to the current i (h, v) in the pixel coordinates (h, v).

$$Rah \times \{va(h-1,v)-va(h,v)\}+Rah \times \{va(h+1,v)-va(h,v)\}+Rav \times \{va(h,v-1)-va(h,v)\}+Rav \times \{va(h,v+1)-va(h,v)\}=i(h,v) \quad \text{(Equation 1)}$$

Note that, h is an integer from 1 to 1920, and v is an integer from 1 to 1080.

In addition, since va (0, v) and va (1921, v), va (h, 0), va (h, 1081) are the amount of voltage drop generated in the line from the variable-voltage source 170 to the organic EL display unit 110 and are sufficiently small to be approximated by 0. In addition, as described above, Rah is the horizontal resistance component (admittance) of the anode-side power source line network 112 and Rav is the vertical resistance component (admittance) of the anode-side power source line network 112.

1920×1080 first-order simultaneous equations for 1920× 1080 unknown variables va (h, v) are obtained by deriving the equation 1 for each pixel 111. Therefore, the voltage drop amount va (h, v) in the voltage in the anode-side power source line network 112 in each pixel 111 can be obtained by solving the first-order simultaneous equations.

Figure 6A:
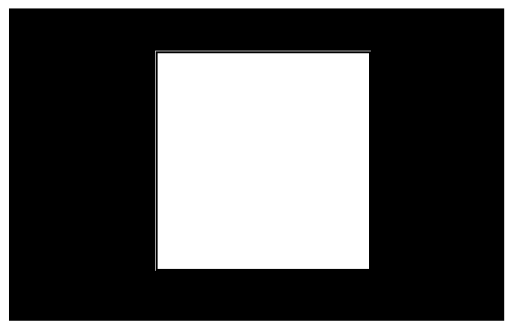
FIG. 6A is a diagram schematically illustrating an example of an image displayed on the organic EL display unit.

FIG. 6A is a diagram schematically illustrating an example of the image displayed on the organic EL display unit 110.

In the image A illustrated in FIG. 8A, the central part of the organic EL display unit 110 is white, and the rest of the organic EL display unit 110 is black.

Figure 6B:
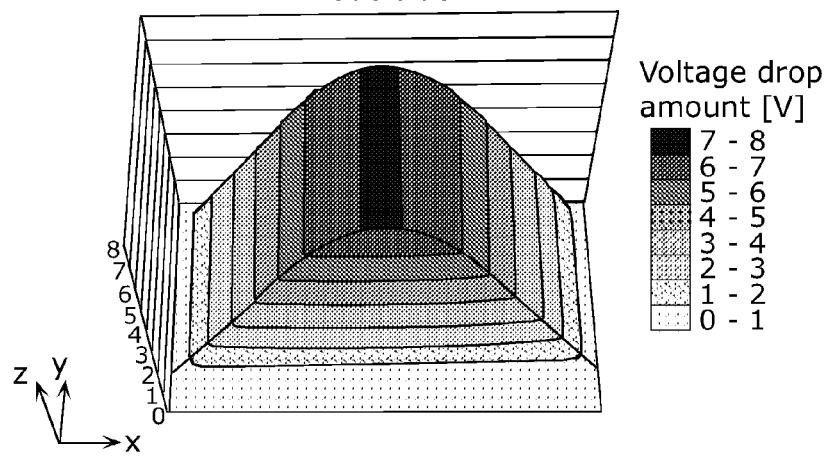
FIG. 6B is a graph illustrating a voltage distribution of the anode-side power source line network calculated from the video signals indicating the image in FIG. 6A.

FIG. 6B is a graph indicating voltage distribution of the anode-side power source line network 112 calculated from the video signal indicating the image A.

X axis in FIG. 6B indicates the pixel coordinate in column direction, y axis indicates the pixel coordinate in row direction, and z axis indicates the amount of voltage drop. More specifically, the pixel coordinates (0, v) correspond to x axis, and the pixel coordinates (h, 0) correspond to y axis.

When the video signal representing the image A is input, the voltage drop amount calculating circuit 150 calculates the voltage drop amount va (h, v) for each pixel coordinates (h, v) from the equation 1, and calculates the voltage distribution of the anode-side power source line network 112 illustrated in FIG. 6B from the calculation result. Here, the anode-side power source line network 112 assumes a one-dimensional line having a substantially infinite vertical resistance component Rav illustrated in FIGS. 2 and 3. In other words, the anode-side power source line network 112 provided corresponding to the pixels 111 in different rows are arranged in parallel with each other in the horizontal direction (row direction). With this, the voltage drop amount in the anode-side power source line network 112 in the rows corresponding to the white region in the image A gradually increases toward the center of the image. In contrast, the voltage drop amount in the anode-side power source line network 112 in the rows other than the rows corresponding to the white region in the image A is substantially 0.

Similarly, the voltage drop amount calculating circuit 150 obtains the horizontal resistance component Rch and the vertical resistance component Rcv in the cathode-side power source line network 113 from the memory 155 after step S11 (step S13).

Next, the voltage drop amount calculating circuit 150 calculates the voltage distribution of the cathode-side power source line network 113 (step S15). More specifically, the voltage drop (increase) amount vc (h, v) in the cathode-side power source line network 113 can be obtained by writing a simultaneous equation for the cathode-side power source line network 113 in the pixel coordinates (h, v), in the same manner as the equation 1, and solving the simultaneous equation for the cathode-side power source line network 113.

Figure 6C:
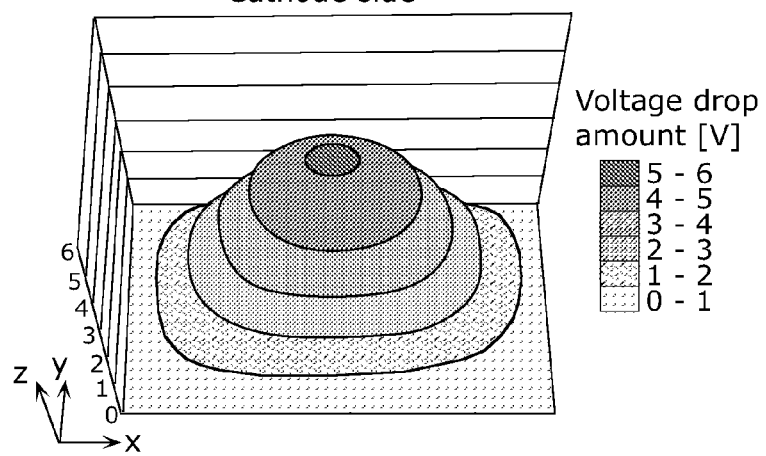
FIG. 6C is a graph illustrating a voltage distribution in a cathode-side power source line network calculated from video signals indicating the image in FIG. 6A.

FIG. 6C is a graph indicating voltage distribution of the cathode-side power source line network 113 calculated from the video signal indicating the image A.

X axis in FIG. 6C indicates the pixel coordinate in column direction, y axis indicates the pixel coordinate in row direction, and z axis indicates the amount of voltage drop.

The voltage drop amount calculating circuit 150 calculates the voltage drop (increase) amount in the cathode-side power source line network 113, in the same manner as the calculation of the voltage drop amount in the anode-side power source line network 112. Here, the cathode-side power source line network 113 is formed in the form of a continuous film. Accordingly, the voltage drop (increase) amount vc (h, v) in the cathode-side power source line network 113 is its largest at the center of the organic EL display unit 110, that is, at the pixel coordinates (960, 540). Note that, the process for calculating the voltage distribution of the anode-side power source line network 112 (step S14) and the process for calculating the voltage distribution of the cathode-side power source line network 113 (step S15) are examples of the first calculating.

Next, the signal processing circuit 160 calculates the voltage at the monitoring point M from the voltage drop amount va (h, v) in the anode-side power source line network 112 and the voltage drop (increase) amount vc (h, v) in the cathode-side power source line network 113 (step S16). More specifically, since the monitoring point M is in the anode-side power source line network 112 in this embodiment, the signal processing circuit 160 sets the voltage drop amount va (960, 540) in the anode-side power source line network 112 as the voltage drop amount at the monitoring point M. Subsequently, the signal processing circuit 160 calculates the voltage at the monitoring point M by subtracting the voltage drop amount va (960, 540) at the monitoring point M from the anode-side voltage output by the variable voltage source 170. In other words, if the voltage necessary for the organic EL element 121 is VEL, the voltage necessary for the driving transistor 125 is VTFT, the voltage at the monitoring point M is set to be VEL+VTFT+va (960, 540) which is a voltage obtained by adding the voltage drop amount va (960, 540) at the monitoring point M calculated from the video signal to VEL+VTFT. In the following description, the voltage at the monitoring point M calculated by the order described above may be denoted as vcalc. Note that, the process for calculating the voltage at the monitoring point M (step S16) is an example of the second calculating.

The voltage measuring unit 180 measures the voltage at the monitoring point M through the monitor line 190 (step S17). Note that, the process for measuring the voltage at the monitoring point M (step S17) is an example of the measuring.

Next, the signal processing circuit 160 controls the external application voltage output by the variable voltage source 170, based on the voltage at the monitoring point M calculated in the process of calculating the voltage at the monitoring point M (step S16) and the voltage at the monitoring point M measured in the process of measuring the voltage at the monitoring point M (step S17) (step S18). More specifically, the signal processing circuit 160 controls the external application voltage output by the variable voltage source 170 from the largest value among the voltage at the monitoring point M calculated in the process for calculating the voltage at the monitoring point M (step S16), the voltage at the monitoring point M measured in the process for measuring the voltage at the monitoring point M (step S17), the calculated difference, and the maximum value of the total voltage drop amount.

Here, the total voltage drop amount is a sum of the voltage drop (increase) amount va (h, v) in the anode-side power source line network 112 and the voltage drop (increase) amount vc (h, v) in the cathode-side power source line network 113 in each pixel |va (h, v)|+|vc (h, v)|. More specifically, the signal processing circuit 160 calculates the distribution of the total voltage drop amount which is the sum of the distribution of the voltage drop amount in the anode-side power line network 112 and the distribution of the voltage drop (increase) in the cathode-side power source 113 by adding the distribution of the voltage drop amount in the anode-side power source line network 112 and the distribution of the voltage drop (increase) amount in the cathode-slide power source line network 113 corresponding to the pixel coordinates (h, v). Subsequently, the maximum value of the in-screen voltage drop vmax at which the calculated distribution of the total voltage drop amount is maximum is calculated.

The voltage distribution in the anode-side power source line network 112 and the voltage distribution in the cathode-side power source line network 113 when the video signal different from the video signal indicating the image A is input to the display device 100 shall be described.

Figure 7A:
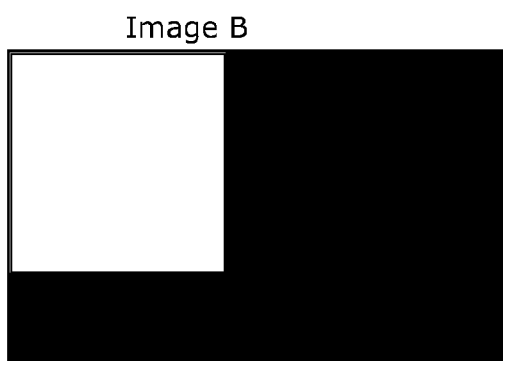
FIG. 7A is a diagram schematically illustrating an example of an image displayed on the organic EL display unit.

FIG. 7A is a diagram schematically illustrating another example of an image displayed on the organic EL display unit.

The image B illustrated in FIG. 7A has a white region with the same size as the white region in the image A in FIG. 6A, which is displayed on a different position from the white region in the image A. More specifically, in the image B, the white region includes the pixel coordinates (1, 1).

Figure 7B:
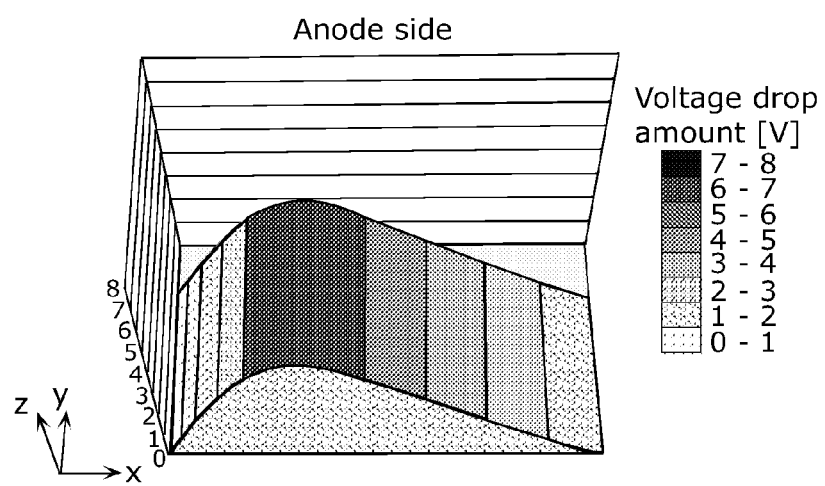
FIG. 7B is a graph illustrating a voltage distribution of the anode-side power source line network calculated from the video signals indicating the image in FIG. 7A.

FIG. 7B is a graph indicating voltage distribution of the anode-side power source line network 112 calculated from the video signal indicating the image B.

X axis in FIG. 7B indicates the pixel coordinate in column direction, y axis indicates the pixel coordinate in row direction, and z axis indicates the amount of voltage drop.

Compared to the voltage distribution of the anode-side power source line network 112 illustrated in FIG. 6B, the voltage distribution in the anode-side power source line network 112 illustrated in FIG. 7B has a distribution peak shifted to the left (toward the pixel coordinates (h, 0)), and a lower peak voltage. More specifically, while the maximum value of the voltage distribution in the anode-side power source line network 112 illustrated in FIG. 6B is 7 to 8 V, the maximum value of the voltage distribution in the anode-side power source line network 112 in FIG. 7B is 4 to 5 V, that is, a reduction by approximately 3 V.

Figure 7C:
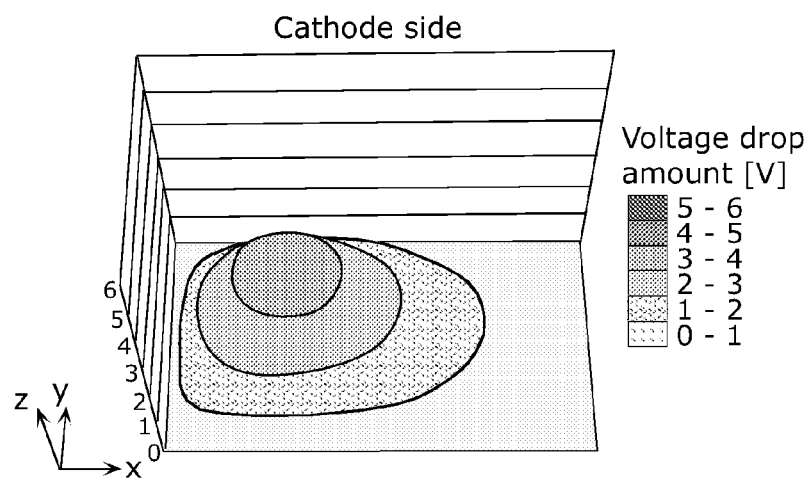
FIG. 7C is a graph illustrating a voltage distribution in a cathode-side power source line network calculated from video signals indicating the image in FIG. 7A.

FIG. 7C is a graph indicating voltage distribution of the cathode-side power source line network 113 calculated from the video signal indicating the image B.

X axis in FIG. 7C indicates the pixel coordinate in column direction, y axis indicates the pixel coordinate in row direction, and z axis indicates the amount of voltage drop.

Compared to the voltage distribution of the cathode-side power source line network 113 illustrated in FIG. 6C, the voltage distribution in the cathode-side power source line network 113 illustrated in FIG. 7C has a distribution peak shifted to the left, and a lower peak voltage, in the same manner as FIG. 7B. More specifically, while the maximum value of the voltage distribution in the cathode-side power source line network 113 illustrated in FIG. 6C is 5 to 6 V, the maximum value of the voltage distribution in the cathode-side power source line network 113 in FIG. 7C is 3 to 4 V, that is, a reduction by approximately 2 V.

In addition, in steps S14 and S15, the voltage drop amount calculating circuit 150 calculates the voltage drop amount for each pixel when the video signal input is provided, and the voltage distribution of the power source line network is calculated from the calculation result. However, the calculation is not limited to the process performed for one frame.

Figure 8:
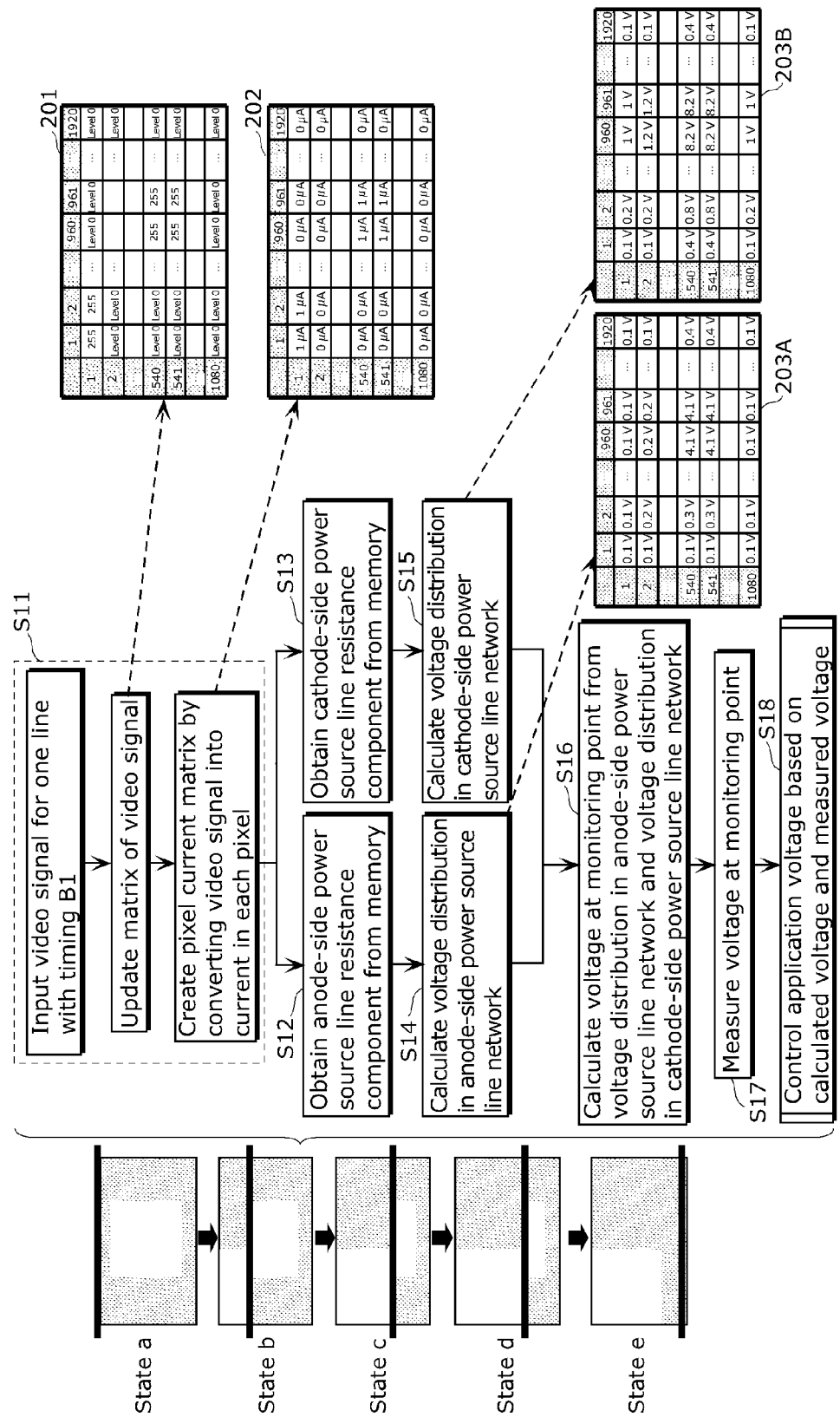
FIG. 8 is a flowchart illustrating an example of the operation by the display device according to the embodiment in detail.

FIG. 8 is a flowchart showing an operation of the display device 100 in detail according to the embodiment. FIG. 8 describes an example of the operational flowchart in FIG. 5 in detail, and illustrates that the calculation of the voltage distribution in the power source line network in steps S14 and S15 is performed per pixel row, instead of per frame. On the left side of FIG. 8, a transition of the image from the state a showing the image A illustrated in FIG. 6A to the state e showing the image B illustrated in FIG. 7A. In other words, the period from the state a to the state e corresponds to one frame period. The following shall describe the operation using the voltage distribution calculation in the power source line network in the state b as an example.

First, the voltage drop amount calculating circuit 150 inputs the video signal for one pixel row updated between the status a and the status b.

Next, the voltage drop amount calculating circuit 150 updates the matrix of the video signal being held. More specifically, in the video signal matrix data 201 illustrated on the right side of FIG. 8, the tone data in the first pixel row is updated in a period between the state a to the state b.

Next, the voltage drop amount calculating circuit 150 creates the pixel current matrix using the updated matrix of the video signal and the conversion formula to the pixel current or the conversion table to the pixel current. More specifically, in the pixel current matrix data 202 illustrated on the right side of FIG. 8, the pixel current data for the first pixel row is updated in the period between the state a and the state b.

Next, the voltage drop amount calculating circuit 150 performs step S12 and step S13 illustrated in FIG. 5.

Next, the voltage drop amount calculating circuit 150 performs step S14 and step S15 illustrated in FIG. 5. More specifically, the voltage drop amount calculating circuit 150 creates the voltage distribution data 203A in the anode-side power source line network and the voltage distribution data 203B in the cathode-side power source line network illustrated on the right side of FIG. 8.

Next, the signal processing circuit 160 calculates the voltage at the monitoring point M from the voltage distribution data 203A in the anode-side power source line network and the voltage distribution data 203B in the cathode-side power source line network (step S16). Here, the signal processing circuit 160 extracts the voltage at the monitoring point M from the voltage distribution data 203A in the anode-side power source line network and the voltage distribution data 203B in the cathode-side power source line network, and performs the subtraction. Note that, the signal processing circuit 160 may create the voltage drop amount matrix data by simply subtracting and adding the voltage distribution data 203A in the anode-side power source line network and the voltage distribution data 203B in the cathode-side power source line network, and extract the voltage drop amount at the monitoring point M from the created voltage drop amount matrix data.

The voltage measuring unit 180 measures the voltage at the monitoring point M through the monitoring line 190 (step S17).

Next, the signal processing circuit 160 controls the external application voltage output by the variable voltage source 170, based on the voltage at the monitoring point M calculated in the process of calculating the voltage at the monitoring point M (step S16) and the voltage at the monitoring point M measured in the process of measuring the voltage at the monitoring point M (step S17) (step S18).

Using the process for controlling the power source voltage corresponding to the state b described above as one unit, the process is performed each time the video signal for one pixel row is updated.

Note that, in FIG. 8, when the process in the state e is performed after the process in the state a, instead of the process being performed for each pixel row, this corresponds to the process for each frame.

Furthermore, in FIG. 8, instead of the process being performed for each pixel row, the process may be performed using pixel rows as one unit.

An advantage of the embodiment in which the process is performed for one frame is that the processing time is secured. In contrast, the advantage of the embodiment in which the process is performed for each pixel row is that the accuracy of the setting of the power source voltage increases, although high-speed process is required.

Next, a specific processing for controlling the application voltage (step S18) shall be described.

Figure 9:
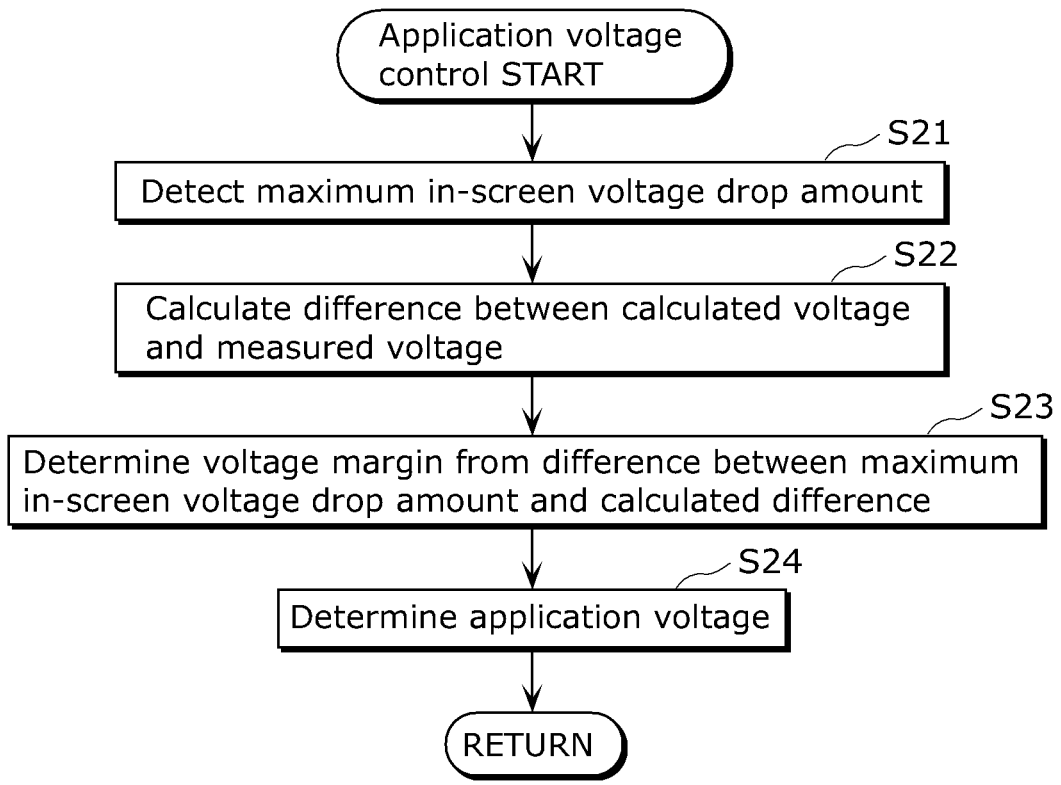
FIG. 9 is a flowchart illustrating the flow of the specific process for controlling the application voltage.

FIG. 9 is a flowchart illustrating a flow of specific processing for controlling the application voltage (step S18). Note that, the process illustrated in FIG. 9 is performed by the signal processing circuit 160.

First, the in-screen maximum voltage drop amount is detected (step S21). More specifically, the maximum value of the in-screen voltage drop amount vmax is calculated.

When the image A illustrated in FIG. 6A and the image B illustrated in FIG. 7A are compared for the maximum values of the voltage drop vmax, vmax in the image A is 12 to 14 V, and vmax in the image B is 7 to 9 V. More specifically, the maximum value vmax calculated in the process for detecting the maximum voltage drop amount (step S21) is different for each image. Particularly, although the image A and the image B have the same size of white region, the white region is displayed in different positions, resulting in different maximum values of the voltage drop amount vmax.

Next, the difference between the voltage at the monitoring point M calculated in the process for calculating the voltage at the monitoring point M (step S16) and the voltage at the monitoring point M measured in the process for measuring the voltage at the monitoring point M (step S17) is calculated (step S22). More specifically, the difference between the voltage at the monitoring point M which is the calculating result and the voltage at the monitoring point M which is the measuring result is calculated. The difference corresponds to temporal change in the organic EL display unit 110, and corresponds to the temporal change in the organic EL element 121, for example. If vmm denotes the voltage at the monitoring point M which is the measuring result, vcalc−vmm is calculated as the difference.

Next, a voltage margin for the external application voltage output from the variable voltage source 170 is determined from the maximum value of the voltage drop amount vmax detected in the process for detecting the maximum voltage drop amount (step S21) and the voltage vcalc−vmm which is the difference calculated in the process for calculating the difference (step S22) is calculated (step S23). More specifically, the voltage margin is determined to be vmax+vcalc−vmm calculated by adding the maximum value of the voltage drop vmax and the difference voltage vcalc−vmm. More specifically, the display device 100 according to the embodiment determines the voltage margin in consideration of the difference corresponding to the temporal change in the organic EL display unit 110. With this, the external application voltage is regulated according to the temporal change.

Furthermore, it is possible to set the external application voltage as small as possible according to the video so as to reduce the power consumption by increasing the voltage supplied from the variable voltage source 170 to the organic EL display unit 110, according to the maximum value of the voltage drop vmax. More specifically, when the video signal representing the image A is input, vmax=12 to 14 V, and when the video signal representing the image B is input, vmax=7 to 9 V. In other words, even if the peak values of the video signals for the image A and the image B are identical, different external application voltage is supplied. Stated differently, when the image B is input, it is possible to reduce the voltage to be supplied to the anode-side power source line network 112 than when the image A is input. In other words, the power consumption can be reduced.

Finally, the external application voltage output by the variable voltage source 170 is determined based on the voltage margin vmax+vcalc−vmm (step S24). More specifically, if the voltage necessary for the organic EL element 121 is VEL, the voltage necessary for the driving transistor 125 is VTFT, the signal processing circuit 160 determines a voltage obtained by adding the voltage margin to VEL+VTFT as the external application voltage. In other words, the external application voltage is determined to be VEL+VTFT+vmax+vcalc−vmm. Subsequently, the determined external application voltage is instructed to the variable voltage source 170. With this, the variable voltage source 170 supplies the voltage with the voltage margin added to the organic EL display unit 110.

Here, while briefly describing the specific configuration of the variable voltage source 170, a reason for the change in the external application voltage output by the variable voltage source 170 according to the voltage instructed by the signal processing circuit 160 shall be described.

Figure 10:
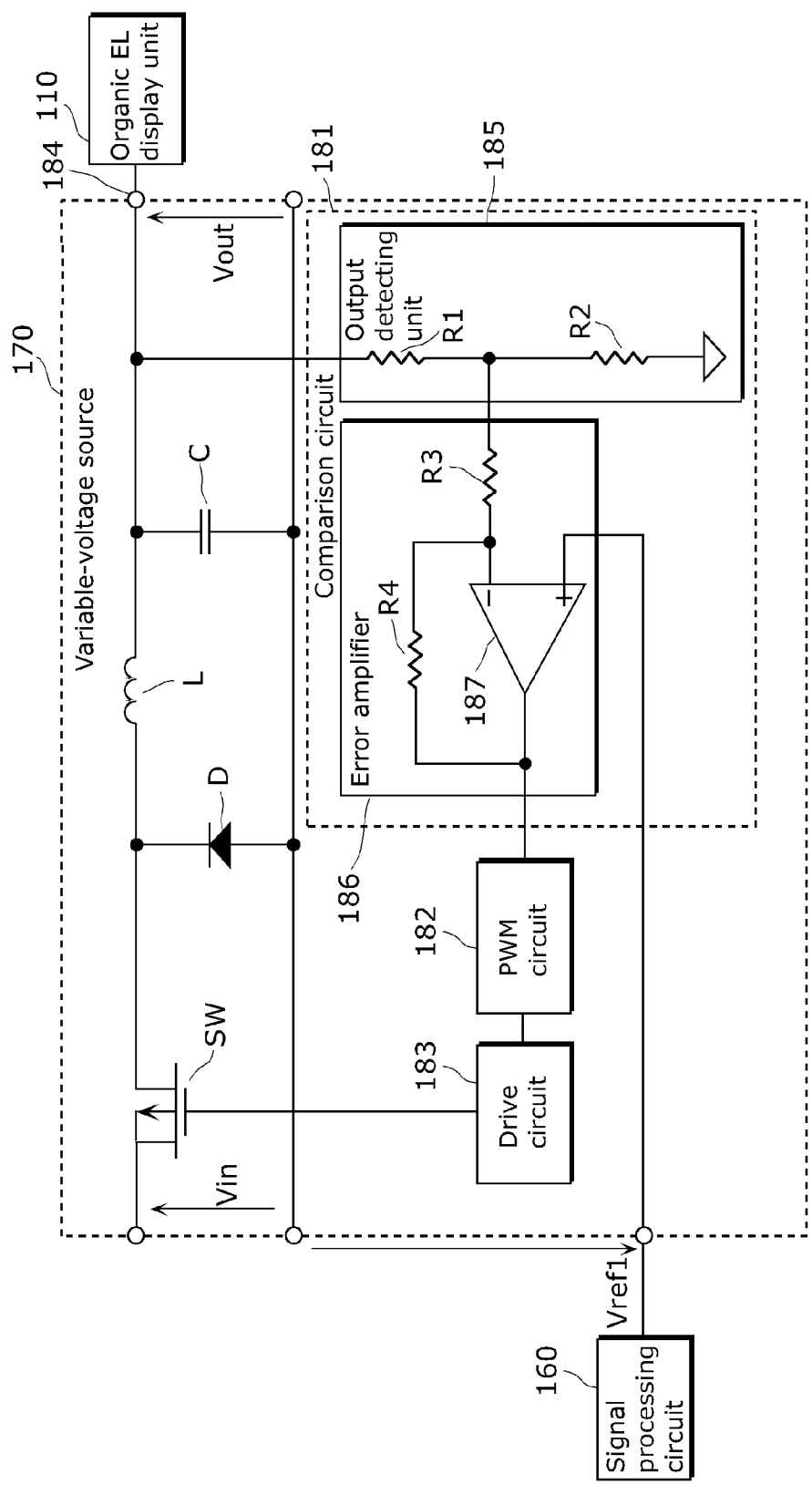
FIG. 10 is a block diagram illustrating an example of the specific configuration of the variable-voltage source.

FIG. 10 is a block diagram showing an example of a specific configuration of a variable-voltage source. Note that the organic EL display unit 110 and the signal processing circuit 160 which are connected to the variable-voltage source are also shown in the figure.

The variable-voltage source 170 shown in the figure includes a comparison circuit 181, a pulse width modulation (PWM) circuit 182, a drive circuit 183, a switch SW, a diode D, an inductor L, a capacitor C, and an output terminal 184, and converts an input voltage Vin into an external application voltage Vout which is in accordance with the first reference voltage Vref1, and outputs the output voltage Vout from the output terminal 184. Note that, although not illustrated, an AC-DC converter is provided in a stage ahead of an input terminal to which the input voltage Vin is inputted, and it is assumed that conversion, for example, from 100 V AC to 20 V DC has already been carried out. Here, the first reference voltage Vref1 is a voltage instructed by the signal processing circuit 160, that is, if VEL is a voltage necessary for the organic EL element 121, and VTFT is the voltage necessary for the driving transistor 125, the first reference voltage Vref1 is VEL+VTFT+vmax+vcalc−vmm. The first reference voltage Vref1 is a voltage using the ground terminal of the variable voltage source 170 as a reference, for example.

The comparison circuit 181 includes an output detecting unit 185 and an error amplifier 186, and outputs a voltage that is in accordance with the difference between the external application voltage Vout and the first reference voltage Vref1, to the PWM circuit 182.

The output detecting unit 185, which includes two resistors R1 and R2 provided between the output terminal 184 and a grounding potential, divides the external application voltage Vout in accordance with the resistance ratio between the resistors R1 and R2, and outputs the voltage-divided external application voltage Vout to the error amplifier 186.

The error amplifier 186 compares the Vout that has been divided by the output detection unit 185 and the first reference voltage Vref1 outputted by the signal processing circuit 160, and outputs, to the PWM circuit 182, a voltage that is in accordance with the comparison result. Specifically, the error amplifier 186 includes an operational amplifier 187 and resistors R3 and R4. The operational amplifier 187 has an inverting input terminal connected to the output detecting unit 185 via the resistor R3, a non-inverting input terminal connected to the signal processing circuit 160, and an output terminal connected to the PWM circuit 182. Furthermore, the output terminal of the operational amplifier 187 is connected to the inverting input terminal via the resistor R4. With this, the error amplifier 186 outputs, to the PWM circuit 182, a voltage that is in accordance with the potential difference between the voltage inputted from the output detecting unit 185 and the first reference voltage Vref1 inputted from the signal processing circuit 160. Stated differently, the error amplifier 186 outputs, to the PWM circuit 182, a voltage that is in accordance with the potential difference between the external application voltage Vout and the first reference voltage Vref1.

The PWM circuit 182 outputs, to the drive circuit 183, pulse waveforms having different duties depending on the voltage outputted by the comparison circuit 181. Specifically, the PWM circuit 182 outputs a pulse waveform having a long ON duty when the voltage outputted by the comparison circuit 181 is large, and outputs a pulse waveform having a short ON duty when the outputted voltage is small. Specifically, the PWM circuit 182 outputs a pulse waveform having a long ON duty when the potential difference between the external application voltage Vout and the first reference voltage Vref1 is large, and outputs a pulse waveform having a short ON duty when the potential difference between the output voltage Vout and the first reference voltage Vref1 is small. Note that the ON period of a pulse waveform is a period in which the pulse waveform is active.

The drive circuit 183 turns on the switch SW during the period in which the pulse waveform outputted by the PWM circuit 182 is active, and turns off the switch SW during the period in which the pulse waveform outputted by the PWM circuit 182 is inactive.

The drive circuit 183 turns the switch SW on and off. The input voltage Vin is outputted, as the external application voltage Vout, to the output terminal 184 via the inductor L and the capacitor C only when the switch SW is turned on. Accordingly, from 0V, the external application voltage Vout gradually approaches 20 V (Vin). At this time, the inductor L and the capacitor C are charged. Since voltage is applied (charged) to both ends of the inductor L, the external application voltage Vout becomes a potential which is lower than the input voltage Vin by such voltage.

As the external application voltage Vout approaches the first reference voltage Vref1, the voltage inputted to the PWM circuit 182 becomes smaller, and the on-duty of the pulse signal outputted by the PWM circuit 182 becomes shorter.

Then, the time in which the switch SW is turned on also becomes shorter, and the external application voltage Vout gradually converges with the first reference voltage Vref1.

The potential of the output voltage Vout, eventually settles to a potential in the vicinity of Vout=Vref1, while having slight voltage fluctuations.

In this manner, the variable-voltage source 170 generates the external application voltage Vout which becomes the first reference voltage Vref1 outputted by the signal processing circuit 160, and supplies the external application voltage Vout to the organic EL display unit 110.

As described above, by increasing the external application voltage supplied from the variable voltage source 170 to the organic EL display unit 110 using vmax+vcalc−vmm as the voltage drop margin supplementing the voltage drop amount, it is possible to set the external application voltage as low as possible according to the video, and to reduce the power consumption.

In addition, the voltage margin can be temporally changed according to the temporal change in the organic EL display unit 110 in consideration of the difference between the voltage at the monitoring point M calculated using the voltage distribution of the anode-side power source line network 112 calculated from the video signal and the voltage at the monitoring point M measured by the voltage measuring unit 180 through the monitoring line 190 as the voltage margin. Accordingly, the power consumption can be reduced in response to the temporal change.

The display device 100 according to the embodiment 1 is a display device including an organic EL display unit 110 having a plurality of pixels 111 that are arranged two-dimensionally, and the display device includes: a variable voltage source 170 which supplies the anode-side voltage and the cathode-side voltage to the organic EL display unit 110; and a voltage regulating unit (the voltage drop amount calculating circuit 150 and the signal processing circuit 160) which regulates the anode-side voltage and the cathode-side voltage output by the variable voltage source 170, according to a video signal representing data indicating luminance of each of the plurality of pixels 111, in which the organic EL display unit 110 further includes an anode-side power source line network 112 and a cathode-side power source line network 113 connected to the pixels 111 and the variable voltage source 170, for supplying the supply voltage from the variable voltage source 170, the display device 100 further includes a voltage measuring unit 180 which measures a voltage which is supplied to a monitor pixel 111M through the anode-side power source line network 112 and the cathode-side power source line network 113, and the voltage regulating unit (the voltage drop amount calculating circuit 150 and the signal processing circuit 160) calculates, from the video signal, a distribution of a voltage drop amount generated in the anode-side power source line network 112 and the cathode-side power source line network 113, calculates a voltage at the anode-side power source line network 112 and the cathode-side power source line network 113 in the monitor pixel 111M from the distribution of the voltage drop amount calculated, and regulates the anode-side voltage and the cathode-side voltage based on the calculation result and the voltage measured by the voltage measuring unit 180.

With this, the anode-side voltage and the cathode-side voltage supplied from the variable voltage source 170 are regulated according to the video signal. Therefore, the power consumption can be significantly reduced. For example, when comparing an image with the white window displayed at the center of the black background as illustrated in FIG. 6A and an image with the white window displayed at the corner of the black background as illustrated in FIG. 7A, the margin for the voltage increase corresponding to the voltage drop amount can be suppressed when the white window is displayed at the corner of the black background. More specifically, by regulating the voltage based on the distribution of the voltage drop amount in the organic EL display unit 110, the external application voltage is regulated according to the video signals, even when the peak values of the video signal are identical, and two video signals for different images are input. Therefore, the power consumption can be reduced.

In addition, the anode-side voltage and the cathode-side voltage supplied to the monitor pixel 111M through the anode-side power source line network 112 and the cathode-side power source line network 113 are measured, and the external application voltage is regulated based on the measured result and the calculation result by the signal processing circuit 160. Accordingly, it is possible to appropriately respond to the temporal change in the organic EL display unit 110. For example, when the measured result and the calculation result are substantially equal, it is considered that there is no temporal change, and the voltage is regulated based on the measuring result or the calculation result. On the other hand, when the measuring result and the calculation result are different, it is considered that there is a temporal change, and the external application voltage is regulated based on the temporal change corresponding to the measuring result and the calculation result.

As described above, the display device 100 according to the embodiment can respond to the temporal change, and can reduce the power consumption.

Furthermore, by reducing the power consumption, the heat generated by the display device 100 is suppressed, thereby preventing the degradation of the organic EL element 121.

In addition, the display device 100 according to the embodiment calculates the maximum value of the voltage drop vmax for each pixel 111 in the screen from the distribution of the total voltage drop amount, and regulates the external application voltage, using the maximum value vmax of the calculated total voltage drop amount.

With this, it is possible to prevent the reduction in the luminance of the pixel 111 due to insufficient voltage.

Variation 1 of Embodiment 1

Note that, in the display device according to the present invention, it is preferable that the voltage margin is regulated, corresponding to the change in temperature, for example. More specifically, a temperature sensor is provided in the organic EL display unit, and the voltage drop amount calculating circuit updates the video signal-pixel current conversion table (or conversion formula) according to the monitored value (measured temperatures) of the temperature sensor, for example. The following shall describe the display device in consideration of the change in temperature.

First, in the display device according to the embodiment 1, a problem possible to a case of temperature change shall be described. When the temperature of the organic EL display unit changes, the mobility and the threshold voltage of the driving transistor changes, and the resistance of the organic EL element changes as well. For example, when the temperature increases, the mobility of the driving transistor increases and the current is more likely to flow in the driving transistor. In addition, the resistance in the organic EL element is reduced as well, and the current is more likely to flow in the organic EL element. With this, the voltage drop amount calculating circuit is affected by the temperature when converting the video signal into the pixel current, causing an error. For example, when the temperature of the organic EL display unit is 25° C., the video signal of level 128 is converted to a pixel current of 1 µA. When the temperature is 60° C., the actual flow of the pixel current for level 128 is the 1.2 µA.

If the flow transitions to the following voltage drop amount calculating flow without taking the change in the pixel current by the temperature into consideration, despite the fact that the current equal to or higher than the estimation (approximately 1.2 times higher) flows, the pixel current value for 25° C. is calculated in the pixel current calculating flow by the voltage drop amount calculating circuit. With this, the amount of voltage drop calculated by the voltage drop amount calculating circuit is lower than the actual value (for example, although the actual voltage drop is 2.4 V, the voltage drop is calculated to be 2.0 V due to the increase in temperature in the calculation flow). Here, if the voltage margin that is initially set is 5 V, the amount of voltage drop is calculated as 2 V in the calculating flow of the amount of voltage drop. Thus, the display device makes an adjustment to reduce the power source voltage for 3 V (5 V−2 V). However, the actual voltage drop is 2.4 V, and thus reducing the power source voltage by 3 V sets the power source voltage lower by 0.4 V. Consequently, the power source voltage enters the linear region of the driving transistor, causing a display error. The display device according to the present disclosure has a configuration in consideration of the change in temperature in order to solve the problem, and is capable of performing an operation for compensating the change in temperature.

Figure 11:
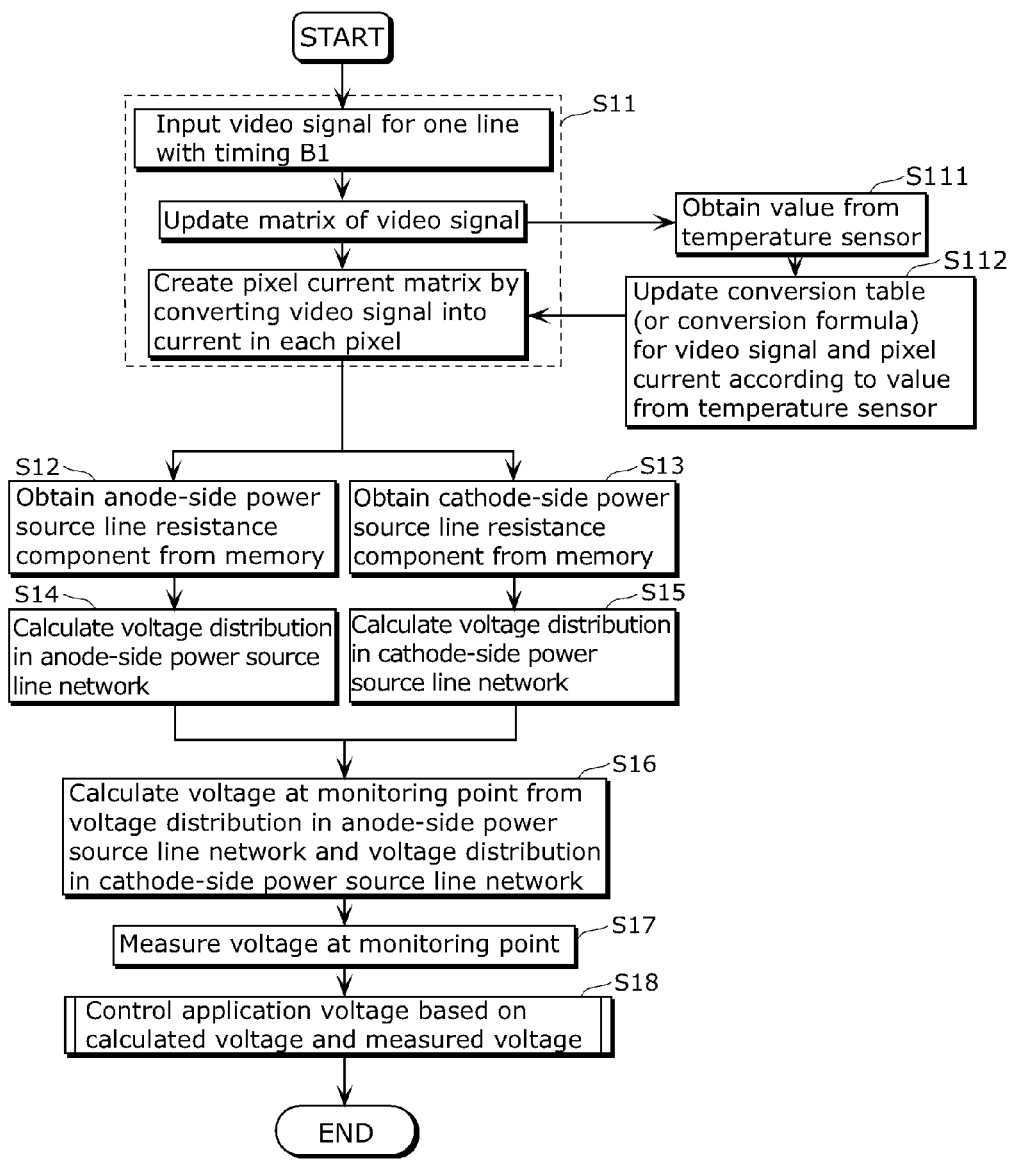
FIG. 11 is a flowchart showing an operation of a display device according to the first variation of the embodiment 1.

FIG. 11 is a flowchart indicating the operation of the display device according to the variation 1 of the embodiment 1 of the present disclosure. In the flowchart according to the variation 1 of the embodiment 1 in FIG. 11, the operation in step S11 is different from the flowchart illustrating a specific example in FIG. 8. In the following description, the overlap with the flowchart in FIG. 8 shall be omitted, and only the difference shall be described.

First, the voltage drop amount calculating circuit 150 inputs the video signal for one pixel row updated between the status a and the status b.

Next, the voltage drop amount calculating circuit 150 updates the matrix of the video signal being held.

Next, the voltage drop amount calculating circuit 150 obtains the measured temperature data by the temperature sensor included in the display device 100 (step S111).

Next, the voltage drop amount calculating circuit 150 updates the video signal-pixel current conversion table (conversion formula) according to the obtained measured temperature data (step S112). More specifically, the voltage drop amount calculating circuit 150 changes the conversion table (or the conversion formula) into a conversion table (or a conversion formula) in consideration with the mobility of the driving transistor, the threshold voltage, and the resistance of the organic EL element at the measured temperature.

Next, the voltage drop amount calculating circuit 150 creates the pixel current matrix using the updated matrix of the video signal and the conversion formula to the pixel current or the conversion table to the pixel current.

With the operational flow described above, the display device according to the present invention allows setting a highly precise voltage margin unaffected by the change in temperature.

The display device according to the embodiment 1 according to the present invention performs creating the video signal matrix, the pixel current matrix, voltage distribution of the power source line network, and the voltage drop amount matrix, setting the voltage margin, and regulating the power source voltage in the variable-voltage source according to the operational flowchart illustrated in FIGS. 5 and 8. However, the operational flow from creating the pixel current matrix to creating the voltage drop amount matrix may be repeated for multiple times in order to increase the accuracy of the voltage margin setting.

Variation 2 of Embodiment 1

Note that, in the embodiment 1, the signal processing circuit 160 regulates the external application voltage using the difference between the voltage at the monitoring point M calculated from the voltage distribution in the anode-side power source line network 112 and the voltage distribution in the cathode-side power source line network 113 and the voltage at the monitoring point M measured by the voltage measuring unit 180. However, the regulation of the external application voltage is not limited to this example. For example, the signal processing circuit 160 may regulate the external application voltage using a ratio of the voltage at the monitoring point M calculated from the voltage distribution in the anode-side power source line network 112 and the voltage distribution at the cathode-side power source line network 113 to the voltage at the monitoring point M measured by the voltage measuring unit 180.

Figure 12:
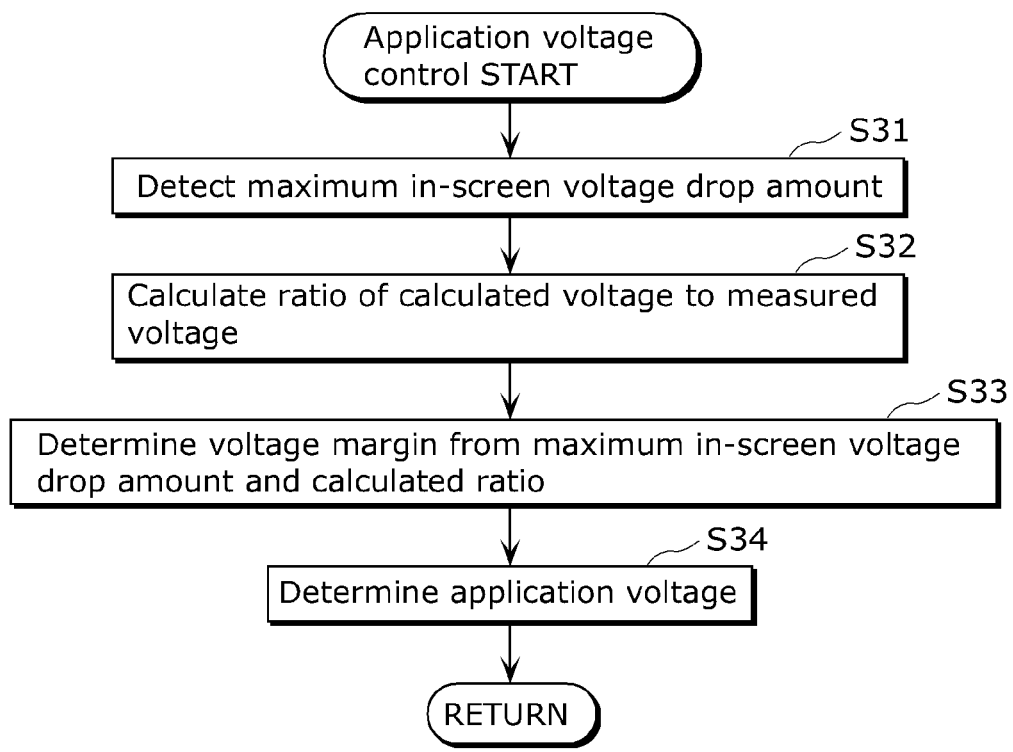
FIG. 12 is a flowchart illustrating the flow of the specific process for controlling the application voltage in the second variation of the embodiment 1.

FIG. 12 is a flowchart illustrating the specific flow of the process for controlling the application voltage (step S18) in this variation. Note that, the process illustrated in FIG. 12 is performed by the signal processing circuit 160.

First, the in-screen maximum voltage drop amount is detected (step S31). Since this process is identical to the process for detecting the in-screen maximum voltage drop amount (step S21) illustrated in FIG. 9, the detailed description for this process shall be omitted.

Next, the ratio of the voltage at the monitoring point M calculated in the process for calculating the voltage at the monitoring point M (step S16) to the voltage at the monitoring point M measured in the process for measuring the voltage at the monitoring point M (step S17) is calculated (step S32). More specifically, the value obtained by dividing the voltage at the monitoring point M measured in the process for measuring the voltage at the monitoring point M (step S17) by the voltage at the monitoring point M calculated in the process for calculating the voltage at the monitoring point M (step S16), that is, vmm/vcalc is calculated.

Next, a voltage margin for the external application voltage output from the variable voltage source 170 is determined from the maximum value of the voltage drop amount vmax detected in the process for detecting the maximum voltage drop amount (step S31) and the ratio vmm/vcalc which is calculated in the process for calculating the ratio (step S32) is calculated (step S33). More specifically, vmax/(vmm/vcalc) which is a value obtained by dividing the maximum voltage drop vmax divided by the ratio vmm/vcalc is determined as the voltage margin. More specifically, the display device 100 according to the embodiment determines the voltage margin in consideration of the difference corresponding to the temporal change in the organic EL display unit 110. Accordingly, in the same manner as the display device 100 according to the embodiment 1, the display device according to the variation can also regulate the external application voltage, according to the temporal change.

Finally, based on the determined voltage margin vmax/(vmm/vcalc), the external application voltage output by the variable voltage source 170 is determined (step S34). More specifically, the signal processing circuit 160 determines the external application voltage as VEL+VTFT+vmax/(vmm/vcalc). Subsequently, the determined external application voltage is instructed to the variable voltage source 170. With this, the variable voltage source 170 supplies the voltage with the voltage margin added, to the organic EL display unit 110.

As described above, the display device according to the variation regulates the external application voltage using the ratio of the voltage at the monitoring point M calculated from the voltage distribution in the anode-side power source line network 112 and the voltage distribution in the cathode-side power source line network 113 to the voltage at the monitoring point M measured by the voltage measuring unit 180.

Embodiment 2

In the embodiment 1, a technique that allows setting the external application voltage as small as possible so as to reduce the power consumption by calculating the voltage drop amount according to the video has been described. For example, in the case of an organic EL display having 1920 pixels horizontally and 1080 pixels vertically, it is necessary to solve 1920×1080 first-order simultaneous equations on the anode side or the cathode side. For this reason, an extremely large calculating circuit is necessary, and there is a problem of increased cost.

In the embodiment 2, in order to address this problem, a method for dividing the pixels into blocks so as to significantly reduce the operation amount shall be described. More specifically, in this embodiment, the voltage regulating unit calculates a distribution of the voltage drop amount for blocks each including a plurality of the pixels, obtained by dividing the pixels equally in a column direction and a row direction.

Note that, the configuration of the display device according to the embodiment 2 is nearly identical to the configuration of the display device 100 according to the embodiment 1, and differs in the function of the voltage drop amount calculating circuit.

Figure 13:
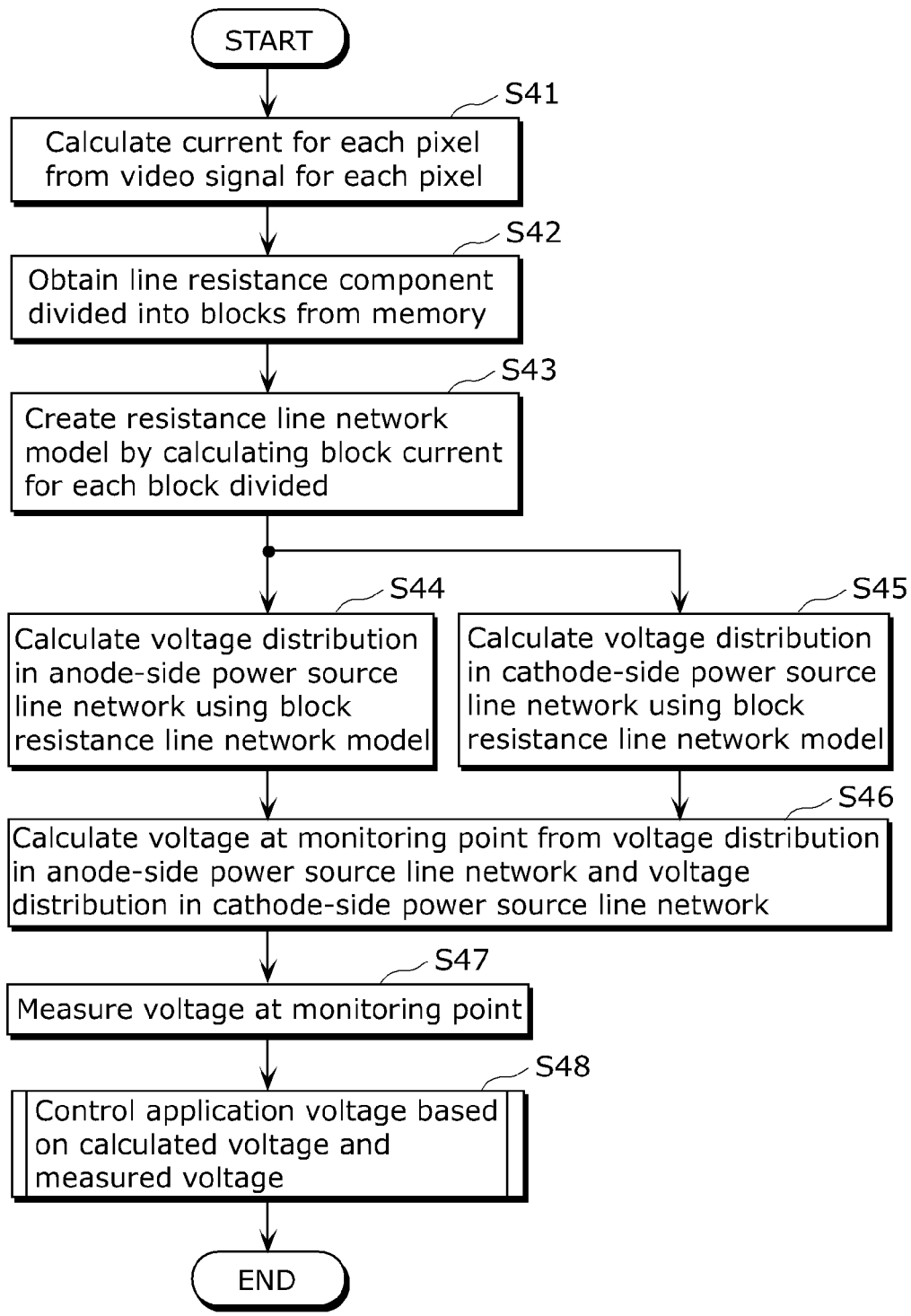
FIG. 13 is a flowchart showing an operation of a display device according to the embodiment 2.

FIG. 13 is a flowchart showing an operation of the display device.

First, the voltage drop amount calculating circuit 150 calculates current flowing in each pixel from the video signal, using the conversion formula or the conversion table for the video signal and pixel current that is set in advance (step S41). Note that, the process for calculating the current flowing in each pixel (step S41) is identical to the process for calculating the current flowing in each pixel (S11) described in the embodiment 1. Accordingly, the detailed description shall be omitted.

Next, the voltage drop amount calculating circuit 150 obtains the horizontal resistance component Rah1 and the vertical resistance component Rav1, in the anode-side power source line network 112 divided into blocks and the horizontal resistance component Rch1 and the vertical resistance component Rcv1 of the cathode-side power source line network 113 divided into blocks from the memory 155 (step S42).

Next, the voltage drop amount calculating circuit 150 calculates a model of the resistance line network when the block current for each block divided, and creates a resistance line network model (step S43). Here, a model of the resistance line network when the blocks are divided shall be described.

Figure 14:
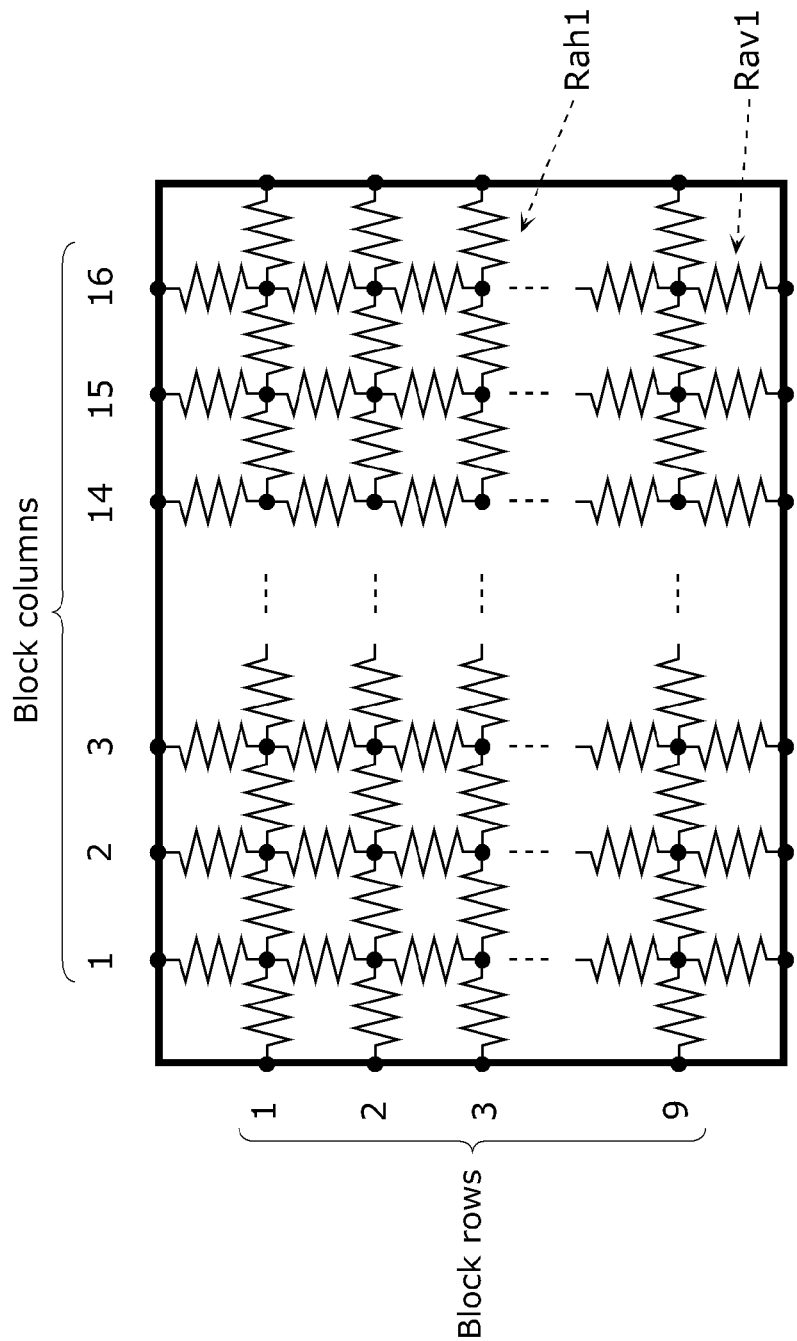
FIG. 14 is a diagram schematically illustrating a model of the anode-side power source line, when one block includes 120 pixels horizontally and 120 pixels vertically.

FIG. 14 is a diagram schematically illustrating a model of the anode-side power source wire 112 in the organic EL display unit 110 having 1920 pixels horizontally and 1080 pixels vertically in which one block includes 120 pixels horizontally and 120 pixels vertically.

Each block is connected to neighboring blocks above, below, and laterally by the horizontal resistance component Rah1 and the vertical resistance component Rav1, and a peripheral part is connected to the anode side electrode at which the external application voltage is applied. In other words, it is considered that one block (120×120 pixels) is provided at an intersection of the horizontal resistance component Rah1 and the vertical resistance component Rav1.

Next, the voltage drop amount calculating circuit 150 calculates the voltage distribution in the anode-side power source line network 112 divided into blocks as illustrated in FIG. 14 (step S44).

Here, the calculation order of the voltage distribution in the anode-side power source line network 112 divided into blocks shall be described.

First, the voltage drop amount calculating circuit 150 calculates block current by calculating a sum of pixel current for each block.

Next, if the voltage drop amount in the second power source line in a block coordinates (h, v) is va1 (h, v), and a block current is i1 (h, v), the following equation 2 with respect to the current in the block coordinates (h, v) is derived.

$$Rah1 \times \{va1(h-1,v) - va1(h,v)\} + Rah1 \times \{va1(h+1,v) - va1(h,v)\} + Rav1 \times \{va1(h,v-1) - va1(h,v)\} + Rav1 \times \{va1(h,v+1) - va1(h,v)\} = i1(h,v) \quad \text{(Equation 2)}$$

Note that h is an integer from 1 to 16, and v is an integer from 1 to 9. Furthermore, va1 (0, v) and va1 (17, v), va1 (h, 0), va1 (h, 10) are voltage drop amount in the line from the variable-voltage source 170 to the organic EL display unit 110, and can be approximated to 0 since the voltage drop amount are sufficiently small. In addition, Rah1 is the horizontal resistance component (admittance) of the anode-side power source wire 112 divided into blocks, and Rav1 is the vertical resistance component (admittance) of the second power source line 113 divided into blocks.

By deriving the equation 2 for each block, 16×9 first-order simultaneous equations for 16×9 unknown variables va1 (h, v) are obtained. By solving the first-order simultaneous equations, the voltage drop amounts va1 (h, v) of the anode-side power source wire 112 in each block when one block is modeled by the 120 pixels horizontally and 120 pixels vertically can be obtained. To put it differently, the voltage distribution of the anode-side power source line 112 can be calculated for each block divided (120 pixels horizontally, 120 pixels vertically).

In the same manner, by obtaining simultaneous equations for the cathode-side power source line network 113 and solving the simultaneous equations, the voltage drop amount vc1 (h, v) of the cathode-side power source line network 113 when the pixels are modeled such that one block includes 120 pixels horizontally and 120 pixels vertically. More specifically, the voltage distribution in the cathode-side power source line network 113 is calculated for each block (120 pixels horizontally and 120 pixels vertically) divided.

Next, the signal processing circuit 160 calculates the voltage at the monitoring point M from the voltage drop amount va1 (h, v) in the anode-side power source line network 112 and the voltage drop amount vc1 (h, v) in the cathode-side power source line network 113 (step S46). More specifically, in this embodiment, the voltage at the block including the monitoring point M is calculated. More specifically, the voltage at the block coordinates (8, 5) is calculated. Subsequently, the signal processing circuit 160 calculates the voltage at the monitoring point M by subtracting the voltage drop amount va1 (8, 5) in the block including the monitoring point M from the anode-side voltage output from the variable voltage source 170. In other words, if the voltage necessary for the organic EL element 121 is VEL, the voltage necessary for the driving transistor 125 is VTFT, the voltage at the monitoring point M is set to be VEL+VTFT+va1 (8, 5) which is a voltage obtained by adding the voltage drop amount va1 (8, 5) at the monitoring point M calculated from the video signal to VEL+VTFT.

The voltage measuring unit 180 measures the voltage at the monitoring point M through the monitoring line 190 (step S47).

Finally, the signal processing circuit 160 controls the external application voltage output by the variable voltage source 170, based on the voltage at the monitoring point M calculated in the process of calculating the voltage at the monitoring point M (step S46) and the voltage at the monitoring point M measured in the process of measuring the voltage at the monitoring point M (step S47) (step S48). More specifically, the signal processing circuit 160 controls the external application voltage output by the variable voltage source 170 from the voltage at the monitoring point M calculated in the process for calculating the voltage at the monitoring point M (step S16), the voltage at the monitoring point M measured in the process for measuring the voltage at the monitoring point M (step S17), the calculated difference and the maximum value of the total voltage drop amount.

Note that, the process for controlling the application voltage (step S48) is identical to the process described with reference to FIG. 9, and thus the detailed description for the process is omitted. Note that, the external application voltage may be adjusted using a ratio of the voltage in the block including the monitoring point M from the voltage distribution in the anode-side power source line network 112 and the voltage distribution in the cathode-side power source line network 113 to the voltage at the monitoring point M measured by the voltage measuring unit 180, in the same manner as the variation of the embodiment 1.

As described above, the display device according to the embodiment 2 is different from the display device according to the embodiment 1 in that the distribution of the voltage drop amount is calculated for the blocks each obtained by dividing the pixels 111 equally in the row direction and the column direction.

With this, the display device according to the embodiment 2 can significantly reduce the operation amount. Thus, it is possible to design space-saving operation circuit, reducing the manufacturing cost.

Note that, one block includes 120 pixels horizontally and 120 pixels vertically in the embodiment 2. However, the number of pixels 111 included in one block is not limited to this example, and may be 60 pixels horizontally and 60 pixels vertically, for example.

Embodiment 3

The display device according to the embodiment 3 is substantially identical to the display device 100 according to the embodiment 1, but is different in that the voltage measuring unit 180 is not included, and the voltage at the monitoring point M is input to the variable voltage source. With this, the display device according to the embodiment 3 is capable of adjusting the external application voltage Vout from the variable voltage source in real time according to the amount of voltage drop. Thus, compared to the embodiment 1, it is possible to prevent temporary reduction of the luminance at the pixel. In addition, it is possible to reduce the operation amount in the signal processing circuit. This allows designing a space-saving operational circuit, reducing cost.

Figure 15:
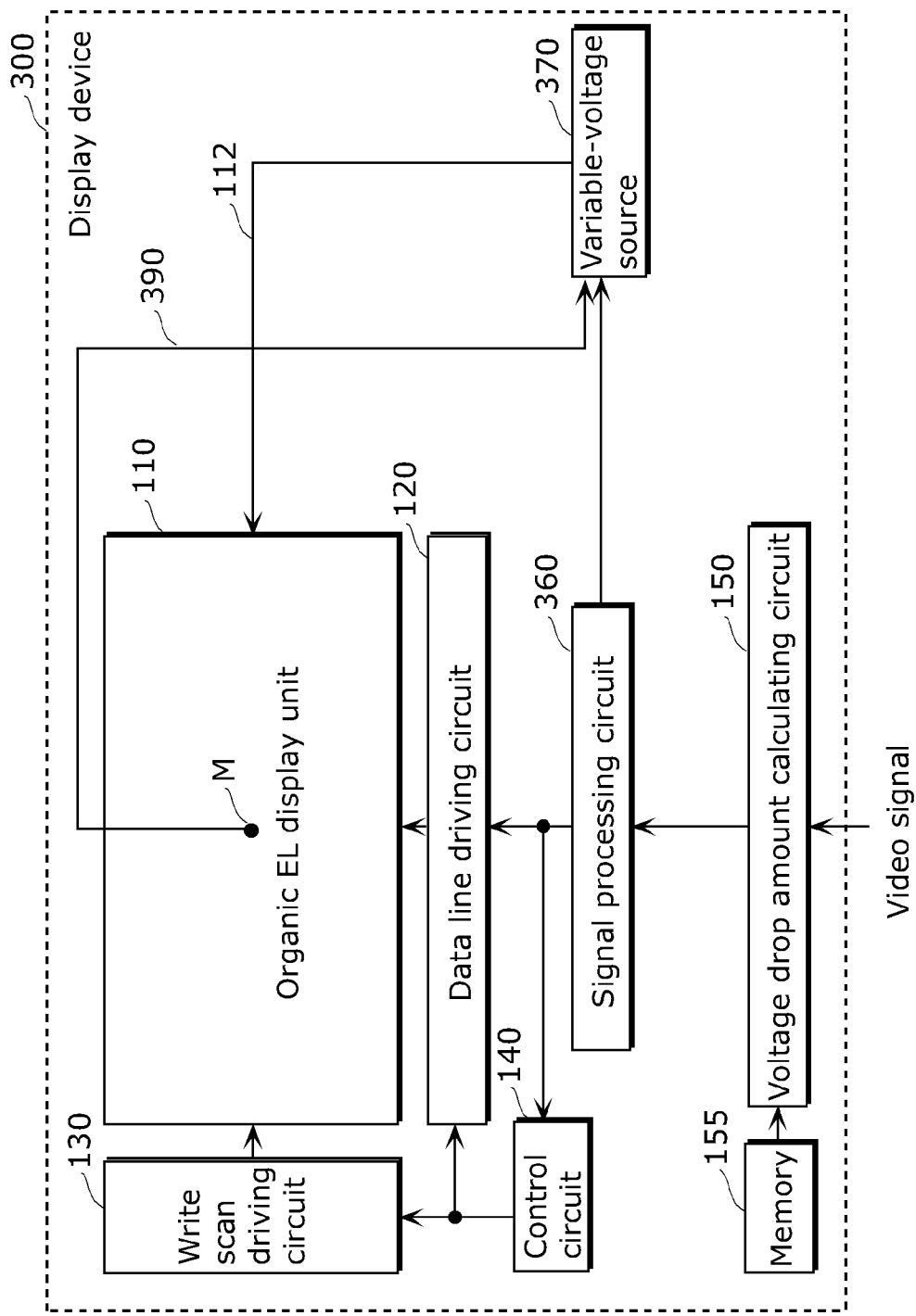
FIG. 15 is a block diagram showing an outline configuration of a display device according to the embodiment 3.

FIG. 15 is a block diagram schematically illustrating the configuration of the display device according to the embodiment 3.

The display device 300 according to the embodiment 3 in FIG. 15 is different from the display device 100 according to the embodiment 1 illustrated in FIG. 1 in that the voltage measuring unit 180 is not included, a monitor line 390 is included instead of the monitor line 190, a signal processing circuit 360 is included instead of the signal processing circuit 160, and a variable voltage source 370 is included instead of the variable voltage source 170.

The signal processing circuit 360 determines a second reference voltage Vref2 output to the variable voltage source 370 from the distribution of the voltage drop amount in the anode-side power source line network 112 and the distribution of the voltage drop amount in the cathode-side power source line network 113 output from the voltage drop amount calculating circuit 150. More specifically, when the voltage necessary for the organic EL element 121 is VEL, the voltage necessary for the driving transistor 125 is VTFT, the signal processing circuit 360 determines the second reference voltage Vref2 to be VEL+VTFT+va (960, 540) which is a voltage obtained by adding the voltage drop amount va (960, 540) at the monitoring point M calculated from the video signal to VEL+VTFT. More specifically, the second reference voltage Vref2 is the voltage vcalc at the monitoring point M obtained by the calculation.

As described above, the second reference voltage Vref2 output by the signal processing circuit 360 in the display device 300 according to the embodiment 3 to the variable voltage source 370 is a voltage determined by the video signal only, unlike the first reference voltage Vref1 output by the signal processing circuit 160 in the display device 100 according to the embodiment 1 to the variable voltage source 170. More specifically, the second reference voltage Vref2 does not depend on the actual voltage Vmm at the monitoring point M.

The variable voltage source 370 measures the voltage at the anode-side power source line network 112 applied to the monitor pixel 111M through the monitor line 390. More specifically, the voltage at the monitoring point M is measured. Subsequently, the external application voltage Vout is regulated according to the voltage at the monitoring point M measured, and the second reference voltage Vref2 output by the signal processing circuit 360.

The monitor line 390 has one end connected to the monitoring point M and the other end connected to the variable voltage source 370, is for transmitting the voltage at the monitoring point M to the variable voltage source 370.

Figure 16:
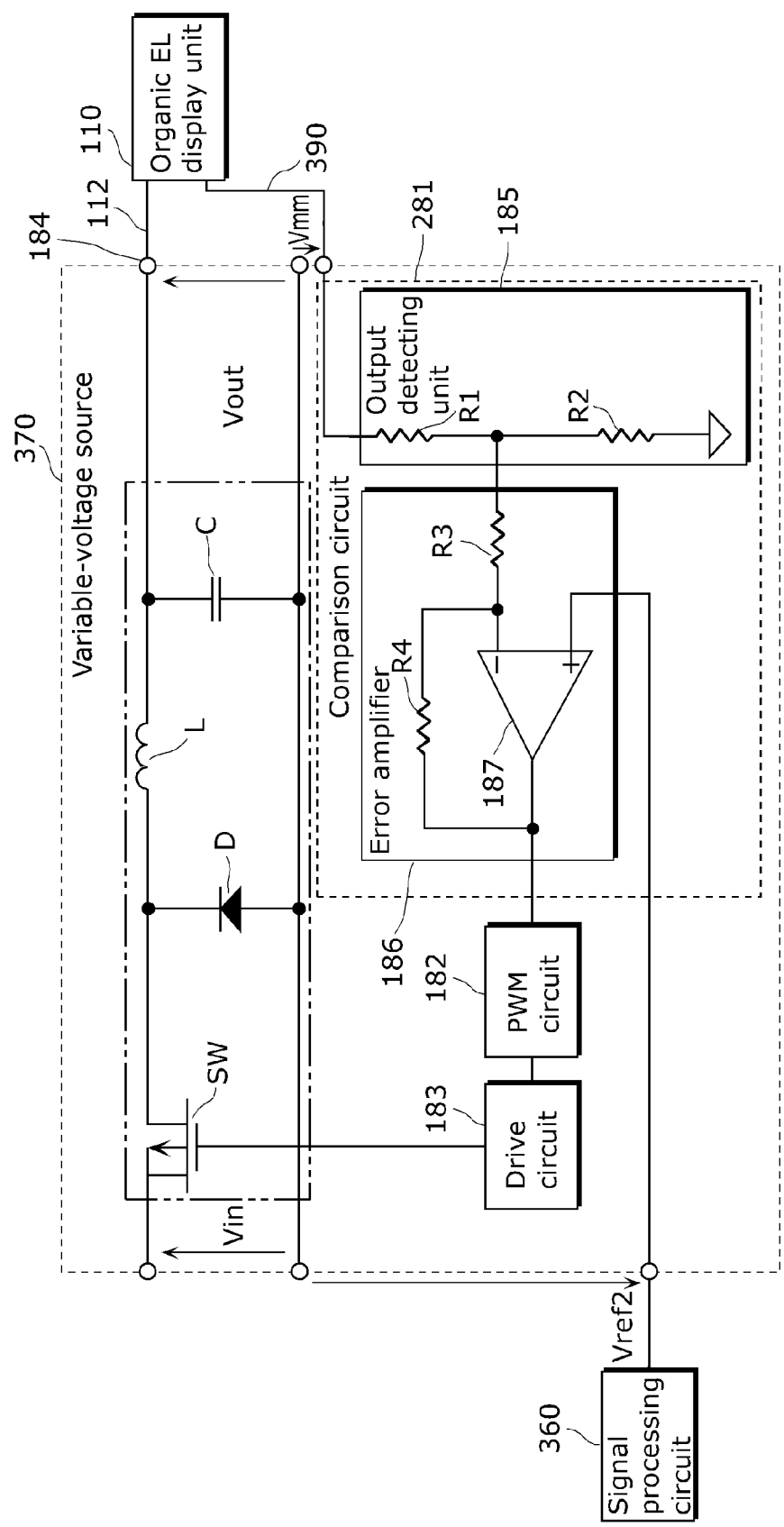
FIG. 16 is a block diagram illustrating an example of the specific configuration of the variable-voltage source.

FIG. 16 is a block diagram showing an example of a specific configuration of a variable-voltage source 370. Note that, FIG. 16 illustrates the organic EL display unit 110 and the signal processing circuit 360 connected to the variable voltage source 370.

The variable voltage source 370 illustrated in FIG. 16 is nearly identical to the configuration of the variable voltage source 170 illustrated in FIG. 10, but is different in that a comparison circuit 281 which compares the voltage at the monitoring point M and the second reference voltage Vref2 is provided, instead of the comparison circuit 181.

Here, if the actual value of the voltage at the monitoring point M is Vmm, the comparison circuit 281 compares Vref and Vmm. As described above, Vref2=Vcalc. Accordingly, the comparison circuit 281 compares vcalc and vmm. The actual measured value vmm, the voltage at the monitoring point M and the second reference voltage Vref2 are, for example, voltages using a ground terminal of the variable voltage source 170 as a reference, for example.

In contrast, in the embodiment 1, the comparison circuit 181 compares Vref1 and Vout. As described above, Vref1=VEL+VTFT+vmax+vcalc−vmm. Thus, Vout can be considered as VEL+VTFT+vmax, and in the embodiment 1, the comparison circuit 181 compares VEL+VTFT+vmax+vcalc−vmm and VEL+VTFT+vmax.

Accordingly, although the comparison circuit 281 compares different values from the comparison circuit 181, the comparison result is the same. More specifically, when the voltage drop amount from the output terminal 184 of the variable voltage source 370 to the monitoring point M is identical in the embodiment 1 and the embodiment 3, the voltage output by the comparison circuit 181 to the PWM circuit and the voltage output by the comparison circuit 281 to the PWM circuit are identical. As a result, the external application voltage Vout from the variable voltage source 170 and the external application voltage Vout from the variable voltage source 370 are identical.

More specifically, the display device 300 according to the embodiment 3 can temporally change the voltage margin in response to the temporal change in the organic EL display unit 110 by taking the difference between the voltage at the monitoring point M calculated from the voltage distribution of the anode-side power source line network 112 calculated from the video signal and the voltage at the monitoring point M measured by the output detecting unit 185 through the monitor line 390. Accordingly, the display device 300 according to the embodiment 3 can achieve the effect that the power consumption can be reduced in response to the temporal change, in the same manner as the display device 100 according to the embodiment 1.

As described above the display device 300 according to the embodiment 3 is nearly identical to the display device 100 according to the embodiment 1, but is different that the voltage measuring unit 180 is not included, and the voltage at the monitoring point M is input to the variable voltage source. With this, the display device 300 according to the embodiment 3 can regulate the external application voltage Vout from the variable voltage source 370 in real time according to the voltage drop amount. Thus, compared to the embodiment 1, it is possible to prevent temporary drop in the luminance at the pixel. In addition, it is possible to reduce the operation amount in the signal processing circuit 360. This allows designing a space-saving operational circuit, reducing cost.

Note that, in the embodiment 3, the voltage drop amount calculating circuit 150, the signal processing circuit 360, the PWM circuit 182, the drive circuit 183, and the error amplifier 186 included in the variable voltage source 370 are examples of the voltage regulating unit. Furthermore, the switch SW, the diode D, the inductor L, and the capacitor C are examples of the voltage source, and the output detecting unit 185 is an example of the voltage measuring unit.

Although only some exemplary embodiments of the display device according to the present invention have been described in detail above, those skilled in the art will readily appreciate that many modifications are possible in the embodiments 1 to 3 and a variation of the embodiment 1 without materially departing from the novel teachings and advantages of the present invention. Accordingly, all such modifications are intended to be included within the scope of the present invention.

Figure 17:
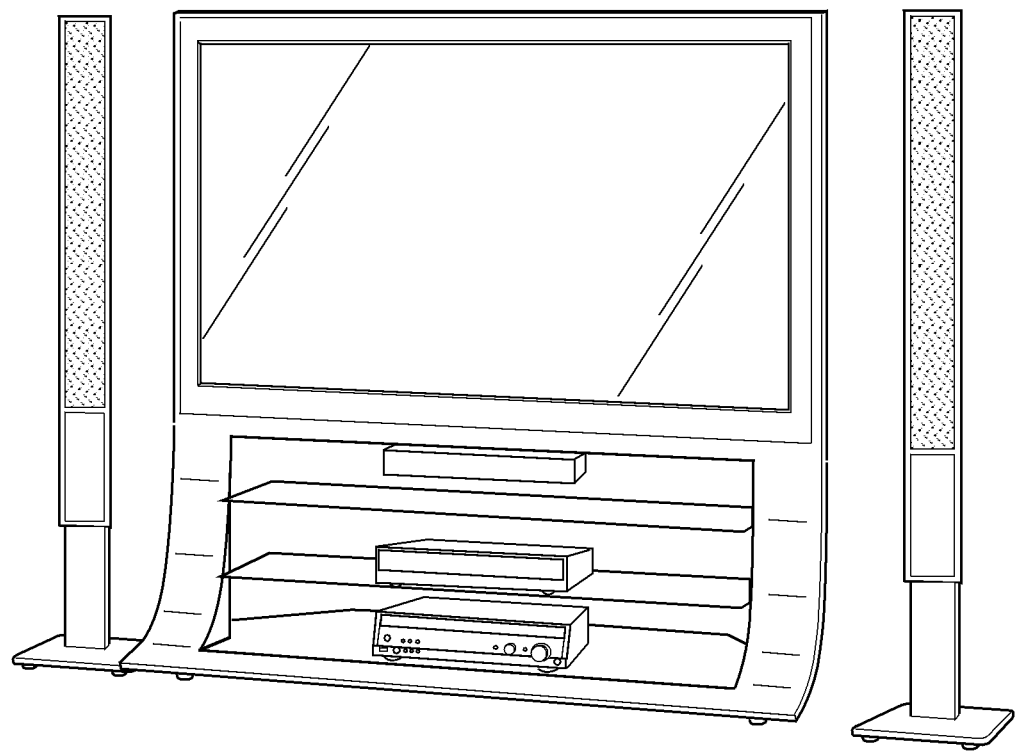
FIG. 17 is an external view of a thin flat TV in which the display device according to the present disclosure is incorporated.

For example, the display device according to the present invention is incorporated in a thin-flat TV as illustrated in FIG. 17. By incorporating the display device according to the present invention, a thin-flat TV capable of displaying a high-definition image reflecting the video signal is implemented.

Furthermore, in the embodiments described above, the external application voltage is regulated by using the maximum total voltage drop amount vmax calculated by adding the voltage drop amount for each pixel 111 in the anode-side power source line network 112, the voltage drop amount for each pixel 111 in the cathode-side power source line network 113 for each pixel. In contrast, the maximum value of the voltage drop amount for each pixel 111 in the anode-side power source line network 112 and the maximum value of the voltage drop amount for each pixel 111 in the cathode-side power source line network 113 are calculated, and the external application voltage may be regulated using the sum of the maximum value of the calculated voltage drop amount for each pixel 111 in the anode-side power source line network 112 and the maximum value of the voltage drop amount in the cathode-side power source line network 113.

With this, even when there are multiple power source lines (the anode-side power source line network 112 and the cathode-side power source line network 113) it is possible to prevent the reduction in the luminance of the pixels 111 due to lack of voltage.

Stated differently, the maximum value vmax of the voltage drop amount for each pixel 111 in the anode-side power source line network 112 and the maximum value vcmax of the voltage drop amount for each pixel 111 in the cathode-side power source line network 113 satisfies vmax≤|vamax|+|vcmax|, compared to the maximum value of the total voltage drop amount vmax. With this, even if the external application voltage is regulated using the maximum value vamax of the voltage drop in the anode-side power source line network 112 and the maximum value vcmax of the cathode-side power source line network 113, the display image is not defected since excessively small voltage drop amount is not estimated.

In addition, in the embodiment 2, the pixels 111 included in one block are in the same number in the horizontal direction (column direction) and the vertical direction (row direction). However, the numbers of the pixels 111 in the horizontal direction and the vertical direction may be different.

Furthermore, in the embodiments described above, both the anode-side voltage and the cathode-side voltage output from the variable voltage source are regulated. However, one of the voltages may be regulated.

In the embodiments described above, the external application voltage is regulated using the estimation of the distribution of the voltage drop amount in the anode-side power source line network 112 and the distribution of the voltage drop amount in the cathode-side power source line network 113. However, the external application voltage may be regulated by estimating one of the distribution of the voltage drop amount in the anode-side power source network 112 and the distribution of the voltage drop amount in the cathode-side power source line network 113, and based on one of the estimated distributions of the voltage drop amount.

Furthermore, in the embodiments described above, the monitoring point M is in the anode-side power source line network 112. However, the monitoring point M may be located in the cathode-side power source line network 113, and in both the anode-side power source line network 112 and the cathode-side power source line network 113.

Furthermore, although the switch transistor 124 and the driving transistor 125 are described as being p-type transistors in the above-described embodiments, they may be configured of n-type transistors.

Furthermore, although the switch transistor 124 and the driving transistor 125 are TFTs, they may be other field-effect transistors.

Furthermore, the processing units included in the display device described above are typically implemented as an LSI which is an integrated circuit. Note that part of the processing units included in the display device 100 can also be integrated in the same substrate as the organic EL display unit 110. Furthermore, they may be implemented as a dedicated circuit or a general-purpose processor. Furthermore, a Field Programmable Gate Array (FPGA) which allows programming after LSI manufacturing or a reconfigurable processor which allows reconfiguration of the connections and settings of circuit cells inside the LSI may be used.

Furthermore, part of the functions of the data line driving circuit, the write scan driving circuit, the control circuit, the voltage drop amount calculating circuit, and the signal processing circuit included in the display devices according to the embodiments of the present invention may be implemented by having a processor such as a CPU executing a program. Furthermore, the present invention may also be implemented as a display device driving method including the characteristic steps implemented through the respective processing units included in the display device 100.

Furthermore, although the foregoing descriptions exemplify the case where the display devices are active matrix-type organic EL display device, the present invention may be applied to organic EL display devices other than the active matrix-type, and may be applied to a display device other than an organic EL display device using a current-driven light-emitting element, such as a liquid crystal display device.

In the embodiment 1, the voltage drop amount calculating circuit 150 calculates the distribution of the voltage drop amount in the anode-side power source line network 112 and the distribution of the voltage drop amount in the cathode-side power source line network 113, and the signal processing circuit 160 calculates the voltage drop amount at the monitoring point M and the maximum voltage drop amount from the distribution of the voltage drop amount. However, these values may be calculated by the voltage drop amount calculating circuit 150.

INDUSTRIAL APPLICABILITY

As described above, the display device according to the present invention is capable of providing a display device that can be driven at low power consumption with the configuration described above. In particular, the configuration is useful for an active organic EL flat-panel display.

The invention claimed is:

1. A display device including a display unit having a plurality of pixels that are arranged two-dimensionally, the display device comprising:

a voltage source which supplies a supply voltage to the display unit; and a voltage regulating unit configured to regulate the supply voltage output by the voltage source, according to video data indicating luminance of each of the plurality of pixels, wherein the display unit further includes at least one power source line connected to the pixels and the voltage source, for supplying the supply voltage from the voltage source, the display device further comprises a voltage measuring unit configured to measure a voltage which is supplied to a predetermined one of the pixels through the at least one power source line, the voltage regulating unit is configured to calculate, from the video data, a distribution of a voltage drop amount generated in the at least one power source line, to calculate a voltage at the at least one power source line in the predetermined one of the pixels from the distribution of the voltage drop amount calculated, and to regulate the supply voltage based on the calculation result and the voltage measured by the voltage measuring unit, the voltage source supplies a first voltage and a second voltage to the display unit, the second voltage being different from the first voltage, the at least one power source line includes a first power source line for supplying the first voltage and a second power source line for supplying the second voltage, and the voltage regulating unit is configured to calculate a first distribution and a second distribution, the first distribution being a distribution of the voltage drop amount in the first power source line, the second distribution being a distribution of the voltage drop amount in the second power line, and to regulate the first voltage and the second voltage, based on a first distribution and a second distribution for each of the pixels calculated, respectively.

2. The display device according to claim 1, further comprising a monitor line having one end connected to the predetermined one of the pixels and the other end connected to the voltage measuring unit, the monitor line being for transmitting the voltage supplied to the predetermined one of the pixels through the at least one power source line.

3. The display device according to claim 1, wherein the voltage regulating unit is configured to calculate a distribution of the voltage drop amount for blocks each including a plurality of the pixels, obtained by dividing the pixels equally in a column direction and a row direction.

4. The display device according to claim 1, wherein the voltage regulating unit is configured to regulate the supply voltage, using a difference between the voltage calculated and the voltage measured by the voltage measuring unit, and a maximum value of the distribution of the voltage drop amount.

5. The display device according to claim 1, wherein the voltage regulating unit is configured to regulate the supply voltage, using a ratio of the voltage calculated to the voltage measured by the voltage measuring unit, and a maximum value of the distribution of the voltage drop amount.

6. The display device according to claim 1, wherein the voltage regulating unit is configured to regulate the first voltage and the second voltage, using a sum of a maximum value of the first distribution and a maximum value of the second distribution.

7. The display device according to claim 1, wherein the voltage regulating unit is configured to calculate a total voltage drop amount which is a sum of the voltage drop amount in the first power source line and the voltage drop amount in the second power source line, by adding the first distribution and the second distribution for each of the pixels, and to regulate the first voltage and the second voltage, using a maximum value of the distribution of the total voltage drop amount calculated.

8. The display device according to claim 1,
wherein each of the pixels includes a driver element and a light-emitting element,
the driver element includes a source electrode and a drain electrode,
the light-emitting element includes a first electrode and a second electrode, the first electrode connected to one of the source electrode and the drain electrode of the driver element, and
one of (i) the other of the source electrode and the drain electrode and (ii) the second electrode is connected to the first power source line, and the other of (i) the other of the source electrode and the drain electrode and (ii) the second electrode is connected to the second power source line.

9. The display device according to claim 8,
wherein the second electrode is a part of a common electrode provided common to the pixels, and
the common electrode is electrically connected to the voltage source such that a voltage is applied from a periphery of the common electrode.

10. The display device according to claim 9, wherein the second electrode is formed of a transparent conductive material made of a metal oxide.

11. The display device according to claim 8, wherein the light-emitting element is an organic EL element.

12. A method for driving a display device including a display unit having a plurality of pixels that are arranged two-dimensionally, and a voltage source which supplies a supply voltage to the display unit, the display unit further including at least one power source line connected to the pixels and the voltage source, for supplying the supply voltage from the voltage source, said method comprising:

calculating a distribution of a voltage drop amount generated in the at least one power source line, from video data indicating luminance of each of the pixels;
calculating a voltage at the at least one power supply line, for a predetermined one of the pixels, from the distribution of the voltage drop amount calculated;
measuring a voltage supplied to the predetermined one of the pixels through the at least one power supply line;
regulating the supply voltage, based on a voltage in the predetermined one of the pixels calculated and the voltage in the predetermined one of the pixels measured,
supplying a first voltage and a second voltage to the display unit, the second voltage being different from the first voltage, the at least one power source line includes a first power source line for supplying the first voltage and a second power source line for supplying the second voltage, and
calculating a first distribution and a second distribution, the first distribution being a distribution of the voltage drop amount in the first power source line, the second distribution being a distribution of the voltage drop amount in the second power line, and regulating the first voltage and the second voltage, based on a first distribution and a second distribution for each of the pixels calculated, respectively.

13. The method of driving the display device according to claim 12, wherein, when calculating the distribution of the voltage drop amount, a distribution of the voltage drop amount is calculated for blocks each including M pixels, obtained by dividing the pixels equally in a row direction and a column direction, where M is an integer greater than or equal to 2.

14. A display device including a display unit having a plurality of pixels that are arranged two-dimensionally, the display device comprising:
a voltage source which supplies a supply voltage to the display unit; and
a voltage regulating unit configured to regulate the supply voltage output by the voltage source, according to video data indicating luminance of each of the plurality of pixels,
wherein the display unit further includes at least one power source line connected to the pixels and the voltage source, for supplying the supply voltage from the voltage source,
the display device further comprises a voltage measuring unit configured to measure a voltage which is supplied to a predetermined one of the pixels through the at least one power source line,
the voltage regulating unit is configured to calculate, from the video data, a distribution of a voltage drop amount generated in the at least one power source line, to calculate a voltage at the at least one power source line in the predetermined one of the pixels from the distribution of the voltage drop amount calculated, and to regulate the supply voltage based on the calculation result and the voltage measured by the voltage measuring unit,
the voltage source supplies a first voltage and a second voltage to the display unit, the second voltage being different from the first voltage,
the at least one power source line network includes a first power source line network for supplying the first voltage and a second power source line network for supplying the second voltage, and
the voltage regulating unit is configured to calculate at least one of a first distribution and a second distribution, the first distribution being a distribution of the voltage drop amount in the first power source line network, the second distribution being a distribution of the voltage drop amount in the second power source line network, and to regulate at least one of the first voltage and the second voltage, based on at least one of a first distribution and a second distribution for each of the pixels calculated, respectively.

* * * * *